(12) United States Patent
Miyagi

(10) Patent No.: US 11,912,388 B2
(45) Date of Patent: Feb. 27, 2024

(54) MARINE VESSEL POWER SUPPLY SYSTEM, AND MARINE VESSEL

(71) Applicant: YAMAHA HATSUDOKI KABUSHIKI KAISHA, Iwata (JP)

(72) Inventor: Yuta Miyagi, Shizuoka (JP)

(73) Assignee: YAMAHA HATSUDOKI KABUSHIKI KAISHA, Shizuoka (JP)

( * ) Notice: Subject to any disclaimer, the term of this patent is extended or adjusted under 35 U.S.C. 154(b) by 380 days.

(21) Appl. No.: 17/505,799

(22) Filed: Oct. 20, 2021

(65) Prior Publication Data

US 2022/0119084 A1 Apr. 21, 2022

(30) Foreign Application Priority Data

Oct. 21, 2020 (JP) .................................. 2020-176751

(51) Int. Cl.
*B63H 1/14* (2006.01)
*B60L 53/20* (2019.01)
(Continued)

(52) U.S. Cl.
CPC ................ *B63H 1/14* (2013.01); *B60L 50/60* (2019.02); *B60L 53/20* (2019.02); *B60L 58/12* (2019.02);
(Continued)

(58) Field of Classification Search
CPC .. B60W 60/0053; B60W 20/40; B60W 40/09; B60W 40/13; B60W 2510/081; B60W 2510/10

See application file for complete search history.

(56) References Cited

U.S. PATENT DOCUMENTS 11,827,375 B1 * 11/2023 Henck ................... B64D 43/00
2008/0100268 A1   5/2008 Lim et al.
(Continued)

FOREIGN PATENT DOCUMENTS

EP    1 100 717 B1    3/2003
EP    3 379 278 A1    9/2018
(Continued)

OTHER PUBLICATIONS

Official Communication issued in European Patent Application No. 21203705.5, dated Jul. 29, 2022.
(Continued)

*Primary Examiner* — Ramsey Refai
(74) *Attorney, Agent, or Firm* — Keating & Bennett, LLP

(57) ABSTRACT

A marine vessel power supply system for a marine vessel including an electric motor to rotate a propeller includes an inverter to supply electric power to the electric motor, a battery to supply electric power to the inverter, and an electronic control unit configured or programmed to control the inverter. The inverter includes an inverter circuit to convert DC electric power supplied from the battery to AC electric power, a voltage detector to detect the voltage in a wiring between the battery and the inverter circuit, and a microcomputer configured or programmed to communicate with the electronic control unit and to control the inverter circuit according to a command supplied from the electronic control unit. The electronic control unit calculates an SOC estimate indicative of an estimated state-of-charge value of the battery based on a value of the voltage detected by the voltage detector and acquired from the microcomputer.

18 Claims, 9 Drawing Sheets

(51) Int. Cl.
  *B60L 50/60* (2019.01)
  *B60L 58/12* (2019.01)
  *B63H 20/28* (2006.01)
  *H05K 7/20* (2006.01)

(52) U.S. Cl.
  CPC ......... *B63H 20/28* (2013.01); *H05K 7/20872* (2013.01); *H05K 7/20927* (2013.01); *B60L 2210/10* (2013.01)

(56) References Cited

U.S. PATENT DOCUMENTS

| | | | |
|---|---|---|---|
| 2010/0274420 A1* | 10/2010 | Veit | B63H 3/10 440/75 |
| 2015/0357852 A1 | 12/2015 | Nakao et al. | |
| 2017/0015397 A1 | 1/2017 | Mitchell et al. | |
| 2017/0291672 A1 | 10/2017 | Maejima | |
| 2017/0349256 A1 | 12/2017 | Nakamura | |
| 2020/0062362 A1 | 2/2020 | Nakamura et al. | |
| 2022/0119084 A1* | 4/2022 | Miyagi | B63H 20/28 |
| 2023/0249795 A1* | 8/2023 | Breyer | B63H 21/383 440/6 |

FOREIGN PATENT DOCUMENTS

| | | |
|---|---|---|
| JP | 2004-260905 A | 9/2004 |
| JP | 2017-190030 A | 10/2017 |
| JP | 2017-218016 A | 12/2017 |
| JP | 2020-029186 A | 2/2020 |

OTHER PUBLICATIONS

Official Communication issued in corresponding European Patent Application No. 21203705.5, dated Apr. 26, 2022.

* cited by examiner

MARINE VESSEL POWER SUPPLY SYSTEM, AND MARINE VESSEL

CROSS REFERENCE TO RELATED APPLICATIONS

This application claims the benefit of priority to Japanese Patent Application No. 2020-176751 filed on Oct. 21, 2020. The entire contents of this application are hereby incorporated herein by reference.

BACKGROUND OF THE INVENTION

1. Field of the Invention

The present invention relates to a marine vessel power supply system which manages the power supply of a marine vessel, and a marine vessel including the same.

2. Description of the Related Art

In US 2017/291672A1, a marine vessel power supply system is disclosed. This system calculates the SOC (State of Charge) of a battery based on the OCV (Open Circuit Voltage) of the battery and the integrated value of an electric current flowing in and out of the battery. The battery SOC indicates the amount of electric power accumulated in the battery. The SOC is correlated with the OCV. The OCV is the voltage of the battery observed when the battery is in an equilibrium state with no electric current flowing between the battery and a load device. In US 2017/291672A1, the battery OCV is detected by an OCV sensor, and the detected OCV is inputted to a battery remaining power amount computing section for a propulsion system. A remote controller ECU determines the battery SOC based on the battery OCV acquired from the propulsion system battery remaining power amount computing section.

SUMMARY OF THE INVENTION

The inventor of preferred embodiments of the present invention described and claimed in the present application conducted an extensive study and research regarding a marine vessel power supply system, such as the one described above, and in doing so, discovered and first recognized new unique challenges and previously unrecognized possibilities for improvements as described in greater detail below.

As described in US 2017/291672A1, the battery SOC can be more accurately determined through the calculation based on both the battery OCV and the integrated value of the electric current flowing in and out of the battery rather than based on the electric current integrated value alone. For the acquisition of the battery OCV, however, a sensor or a circuit for detecting the battery OCV is necessary, and a communication module for transmitting a detected OCV value to an electronic control unit for controlling the charging and the discharging of the battery is also necessary.

In order to overcome the previously unrecognized and unsolved challenges described above, preferred embodiments of the present invention provide marine vessel power supply systems for marine vessels each including an electric motor to rotate a propeller.

A marine vessel power supply system according to a preferred embodiment of the present invention includes an inverter to supply electric power to the electric motor, a battery to supply electric power to the inverter, and an electronic control unit configured or programmed to control the inverter. The inverter includes an inverter circuit to convert DC electric power supplied from the battery to AC electric power, a voltage detector to detect the voltage in a wiring between the battery and the inverter circuit, and a microcomputer configured or programmed to communicate with the electronic control unit and to control the inverter circuit according to a command supplied from the electronic control unit. The electronic control unit calculates an SOC estimate indicative of an estimated state-of-charge value of the battery based on a value of the voltage detected by the voltage detector and acquired from the microcomputer.

With the above structural arrangement, when the electronic control unit sends the command to the microcomputer of the inverter, the DC electric power of the battery is converted to the AC electric power by the inverter circuit of the inverter, and the AC electric power is supplied to the electric motor. Thus, the electric motor is driven to rotate the propeller. The voltage detector of the inverter detects the voltage in the wiring between the battery and the inverter circuit. The OCV of the battery is able to be detected by the voltage detector of the inverter. Therefore, the microcomputer of the inverter is able to acquire the voltage value detected by the voltage detector as the battery OCV, and send the battery OCV to the electronic control unit. The electronic control unit is configured or programmed to estimate the state of charge of the battery based on the detected voltage value (particularly, the battery OCV) acquired from the inverter.

Thus, the battery OCV is acquired by using the voltage detector and the microcomputer of the inverter, thus obviating the need to additionally provide the voltage sensor or the voltage detection circuit for the detection of the battery OCV. Further, there is no need to additionally provide a communication module for communications with the electronic control unit. Thus, the battery remaining power amount is accurately determined without the addition of the sensor and the like.

The voltage detector may detect a voltage between opposite electrodes of the battery by detecting the voltage in the wiring. The voltage detector may detect a voltage between a positive electrode wiring and a negative electrode wiring of the inverter.

In a preferred embodiment of the present invention, the marine vessel power supply system may additionally include at least one of the following features.

The marine vessel power supply system may further include an actuation switch operable by a user when a plurality of electric devices including the inverter and the electronic control unit are to be actuated. The electronic control unit may calculate the SOC estimate based on the detected voltage value acquired from the microcomputer before the electric power is supplied to the electric motor from the inverter after the plurality of electric devices are actuated by the operation of the actuation switch.

With the above structural arrangement, when the inverter and the electronic control unit are actuated with the actuation switch turned on, the voltage value detected by the voltage detector of the inverter is sent to the electronic control unit from the microcomputer of the inverter. Thereafter, the electric power of the battery is supplied to the electric motor via the inverter. The voltage value detected before the electric power of the battery is supplied to the electric motor via the inverter corresponds to the battery OCV. After the electric power of the battery is supplied to the electric motor via the inverter, it is impossible to accurately measure the battery OCV until the voltage of the battery is stabilized. Therefore, the OCV is accurately and speedily determined by acquiring the voltage value detected by the voltage detector before the electric power of the battery is supplied to the electric motor. This obviates the need to wait until stabilization of the voltage of the battery.

The inverter may further include a current detector to detect an electric current flowing between the battery and the electric motor. The electronic control unit may update the SOC estimate based on a value of the electric current detected by the current detector and acquired from the microcomputer after the SOC estimate is calculated based on the detected voltage value acquired from the microcomputer.

With the above structural arrangement, the inverter includes the current detector in addition to the voltage detector. When the inverter and the electronic control unit are actuated by the operation of the actuation switch, the voltage value detected by the voltage detector of the inverter (corresponding to the battery OCV) is sent to the electronic control unit from the microcomputer of the inverter. Thus, the battery SOC estimate is determined. When the electric power of the battery is thereafter supplied to the electric motor via the inverter, the electric current flowing between the battery and the electric motor is detected by the current detector of the inverter, and the detected electric current value is sent to the electronic control unit from the microcomputer of the inverter. The electronic control unit updates the SOC estimate based on the detected electric current value acquired from the microcomputer of the inverter. When the battery is discharged or charged after the update of the SOC estimate, the electronic control unit updates the SOC estimate again based on the detected electric current value acquired from the microcomputer of the inverter. Thus, the latest SOC estimate is determined in real time. Further, the SOC estimate is updated by using the current detector and the microcomputer of the inverter, thus obviating the need for additionally providing the current sensor or the current detection circuit and obviating the need for additionally providing the communication module for communications with the electronic control unit.

The current detector may be either a current detection circuit or a current sensor. The current detector may detect an electric current flowing through a wiring between the battery and the inverter circuit, or may detect an electric current flowing through a wiring between the electric motor and the inverter circuit. The current detector may detect an electric current flowing in the inverter circuit.

The electronic control unit may continuously update the SOC estimate based on the detected electric current value acquired from the microcomputer without consideration of the detected voltage value acquired from the microcomputer until the actuation switch is turned off after the SOC estimate is calculated based on the detected voltage value acquired from the microcomputer.

With the above structural arrangement, the actuation switch is turned off after the battery OCV is sent to the electronic control unit from the microcomputer of the inverter and the electronic control unit determines the battery SOC estimate. Then, the electronic control unit continuously updates the SOC estimate based on the electric current value detected by the current detector of the inverter until the inverter and the electronic control unit are stopped. At this time, the voltage value detected by the voltage detector of the inverter is not taken into consideration.

As described above, it is impossible to accurately measure the battery OCV until the voltage of the battery is stabilized after the electric power of the battery is supplied to the electric motor via the inverter. Therefore, the state of charge of the battery is more accurately determined by updating the SOC estimate based on the integrated value of the electric current flowing in and out of the battery than by updating the SOC estimate based on the voltage of the battery.

The marine vessel power supply system may further include an electric power generator, a rectifier/regulator to convert AC electric power generated by the electric power generator to DC electric power, and a DC/DC converter to increase the voltage of the DC electric power supplied from the rectifier/regulator and supply the DC electric power having the increased voltage to the battery.

With the above structural arrangement, the rectifier/regulator converts the AC electric power generated by the electric power generator to the DC electric power. The DC/DC converter increases the voltage of the DC electric power supplied from the rectifier/regulator, and supplies the DC electric power having the increased voltage to the battery. Therefore, the electric power generated by the electric power generator is supplied to the battery to charge the battery even if the voltage of the DC electric power supplied from the rectifier/regulator is lower than the rated voltage of the battery.

Another preferred embodiment of the present invention provides a marine vessel, which includes a marine vessel power supply system according to a preferred embodiment of the present invention described above, a propeller, an electric motor to receive electric power supplied thereto from the marine vessel power supply system to rotate the propeller, and a hull to travel on water due to the rotation of the propeller.

With the above structural arrangement, when the electronic control unit sends the command to the microcomputer of the inverter, the DC electric power of the battery is converted to the AC electric power by the inverter circuit of the inverter, and the AC electric power is supplied to the electric motor. Thus, the electric motor and the propeller are rotated to propel the hull on the water. As described above, the remaining power amount of the battery is more accurately determined without the addition of the sensor and the like. This ensures more accurate determination of the battery remaining power amount, while preventing an increase in the number of the components of the marine vessel.

In the present preferred embodiment, the marine vessel may additionally include at least one of the following features.

The electric motor and the inverter may be disposed outside the hull.

With the above structural arrangement, the electric motor and the inverter are disposed outside the hull. Therefore, the electric motor and the inverter are disposed near the water surface around the marine vessel. The temperature is lower near the water surface than at a position spaced apart from the water surface. Therefore, the electric motor and the inverter are able to be cooled with lower temperature air.

The marine vessel may further include a casing to accommodate the inverter. The inverter may further include a case to accommodate the inverter circuit, the voltage detector, and the microcomputer.

With the above structural arrangement, the inverter is disposed in the casing, and the inverter circuit, the voltage detector, and the microcomputer of the inverter are disposed in the case of the inverter. Thus, the inverter circuit and the like are protected from solid matter such as dust and liquid such as water. Particularly, water such as seawater or freshwater is present around the marine vessel and, therefore, water splash and water droplets are liable to intrude into the marine vessel. The inverter circuit and the like are protected from the water.

The marine vessel may further include a cooling water channel extending through the case of the inverter, and a water pump to supply water from outside the marine vessel into the cooling water channel.

With the above structural arrangement, the water pump sucks in the water from outside the marine vessel, and supplies the water into the cooling water channel. The water flowing through the cooling water channel passes through the case of the inverter to cool the inverter. If a cooling liquid is circulated in the marine vessel to cool the inverter, the temperature of the cooling liquid will be gradually increased. In contrast, the temperature of the water outside the marine vessel is generally constant irrespective of the period of use of the marine vessel. This makes it possible to cool the inverter with stable-temperature water.

The marine vessel may further include a water pressure sensor provided in the case of the inverter to detect the internal water pressure of the cooling water channel.

With the above structural arrangement, the internal water pressure of the cooling water channel is able to be detected by the water pressure sensor. Thus, whether or not the water is supplied into the cooling water channel is detected. Further, the water pressure sensor is disposed in the case of the inverter, and the inverter is disposed in the casing. This makes it possible to protect the water pressure sensor from solid matter such as dust and liquid such as water.

The marine vessel may further include a cooling water channel which guides water for cooling the inverter, and a water pump to supply the water from outside the marine vessel into the cooling water channel.

With the above structural arrangement, the water pump sucks in the water from outside the marine vessel, and supplies the water into the cooling water channel. The water flowing through the cooling water channel cools the inverter. If a cooling liquid is circulated in the marine vessel to cool the inverter, the temperature of the cooling liquid will be gradually increased. In contrast, the temperature of the water outside the marine vessel is generally constant irrespective of the period of use of the marine vessel. This makes it possible to cool the inverter with stable temperature water.

A portion of the cooling water channel may be disposed in the inverter, or may be disposed on the outer surface of the inverter. In the former case, the inverter may define a portion of the cooling water channel. In this case, the water supplied to the cooling water channel by the water pump is brought into direct contact with the inverter to cool the inverter. This makes it possible to efficiently cool the inverter.

The electric motor and the inverter may be mounted on a casing of an outboard motor that includes the propeller. With this structural arrangement, it is possible to complete the wiring (three-phase wirings, for example) between the electric motor and the inverter at the casing of the outboard motor. Therefore, the wiring is substantially free from being affected by the steering of the outboard motor, thus contributing to a stable control of the electric motor. Moreover, it is possible to perform the wiring between the electric motor and the inverter when the outboard motor is assembled in a factory, so that it is unnecessary to perform the wiring when the outboard motor is mounted on a hull. This makes it possible attain a precise wiring length between the electric motor and the inverter, thus attaining a stable control of the electric motor. Furthermore, a short wiring length is also attained so that it is possible to reduce noise that arises when the electric motor is energized thus reducing the effects of noise on the power supply system as well as peripheral equipment.

The casing may include a lower case to which the propeller is attached and an upper case coupled to the lower case and arranged above the lower case. The electric motor and the inverter may be mounted on the upper case. With this structural arrangement, it is possible to complete the wiring (three-phase wirings, for example) between the electric motor and the inverter at the upper case. It is, therefore, possible to further shorten the wiring, and also to attain a more precise wiring length. Furthermore, it becomes easier to apply the same wiring length to different models of outboard motors. Variation in the wirings between the electric motor and the inverter are accordingly reduced, and man-hours to adapt the control parameters in the system to the wiring length are also reduced accordingly.

A case of the inverter may be located at a height such that at least a portion of the case is under water outside the upper case. With this structural arrangement, it is possible to cool the inverter with water around the outboard motor. It is, therefore, possible to omit a pump that sends cooling water to cool the inverter, and to omit a cooling water channel from a pump to the inverter.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
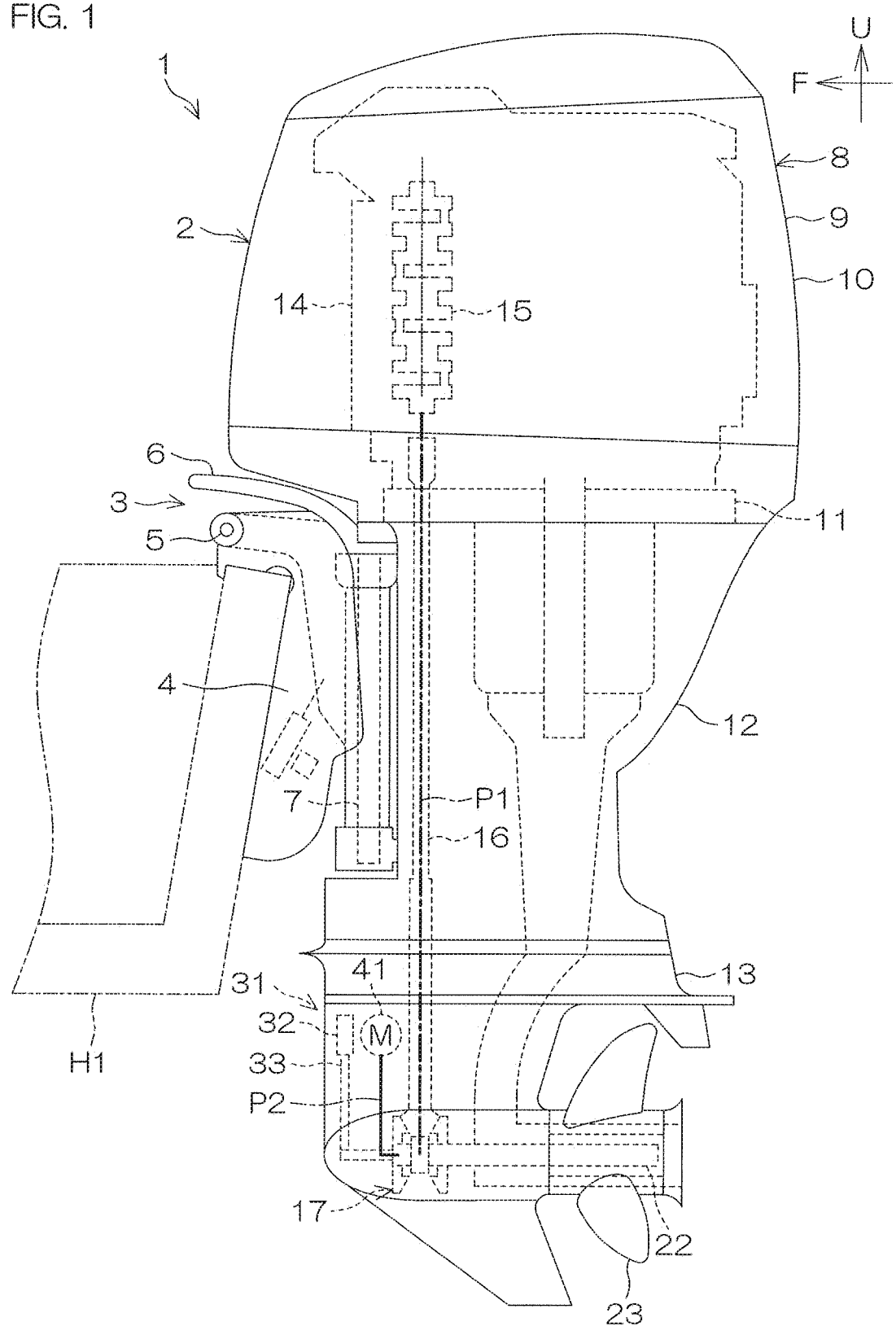
FIG. 1 is a schematic diagram of a marine vessel according to a preferred embodiment of the present invention.
Figure 2:
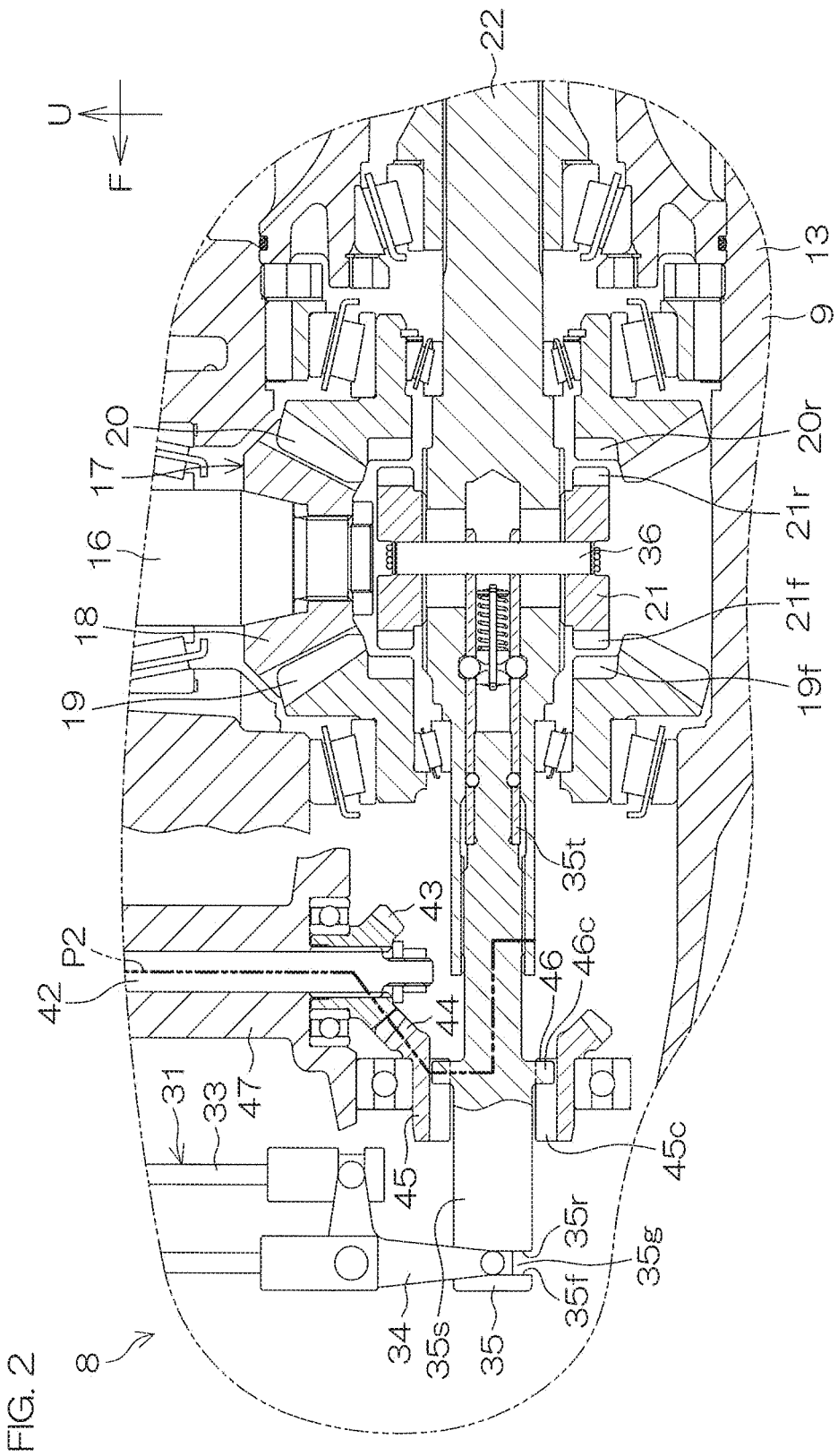
FIG. 2 is a sectional view that shows a vertical section of an outboard motor provided in the marine vessel.
Figure 3:
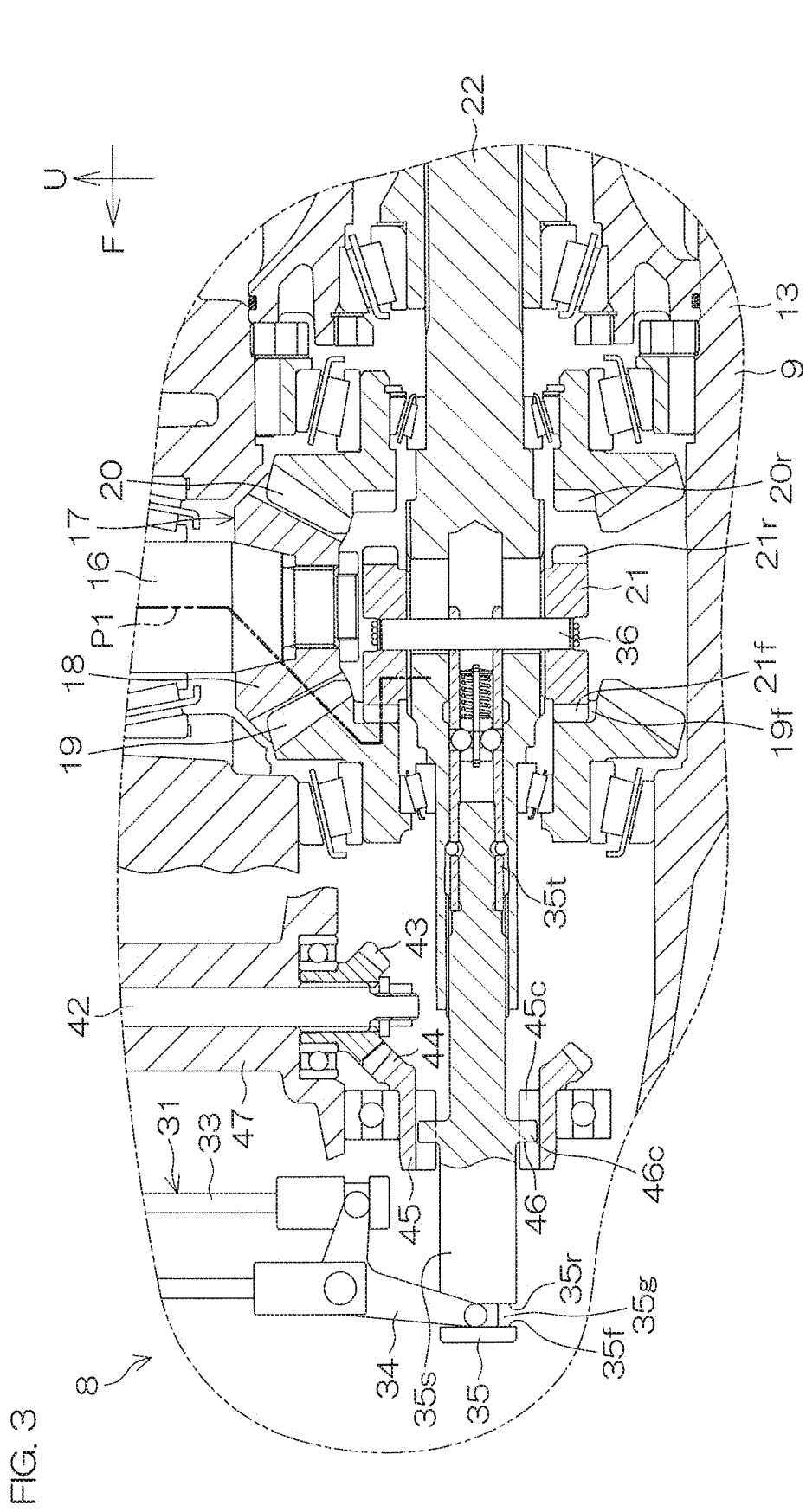
FIG. 3 is another sectional view that shows a vertical section of the outboard motor provided in the marine vessel.

FIG. 1 is a schematic diagram of a marine vessel 1 according to a preferred embodiment of the present invention. FIGS. 2 and 3 are sectional views each of which shows a vertical section of an outboard motor 8 provided in the marine vessel 1.

FIG. 1 illustrates a left side of the outboard motor 8. FIG. 2 illustrates a state in which a first dog clutch 21 is located at a neutral position, and a second dog clutch 46 is located at an intermediate connection position. FIG. 3 illustrates a state in which the first dog clutch 21 is located at a forward drive position, and the second dog clutch 46 is located at a front connection position. In FIGS. 1 to 3, arrows U and F indicate the upward direction and the forward direction, respectively, with respect to a hull H1.

As shown in FIG. 1, the marine vessel 1 includes a hull H1 which floats on a water surface, and a propulsion system 2 which propels the hull H1. The propulsion system 2 includes an outboard motor 8 disposed behind the hull H1, and a suspension device 3 which attaches the outboard motor 8 to the back side of the hull H1. The propulsion system 2 further includes a steering device which turns the outboard motor 8 laterally of the hull H1, and a tilt device which turns the outboard motor 8 vertically of the hull H1.

The suspension device 3 includes a clamp bracket 4 attachable to the stern of the marine vessel, a swivel bracket 6 supported by the clamp bracket 4 via a laterally extending tilt shaft 5, and a steering shaft 7 supported by the swivel bracket 6. The swivel bracket 6 is pivotal about the laterally extending tilt shaft 5 with respect to the clamp bracket 4. The steering shaft 7 is rotatable about its vertical axis with respect to the swivel bracket 6.

The outboard motor 8 is connected to an upper end and a lower end of the steering shaft 7 via an upper mount and a lower mount, respectively. The outboard motor 8 is pivoted together with the steering shaft 7 about the steering shaft 7. The outboard motor 8 is pivotable about the steering shaft 7 laterally of the hull H1, and is pivotable about the tilt shaft 5 vertically of the hull H1.

The outboard motor 8 includes a first power train including an engine 14, and a second power train including an electric motor 41. The engine 14 and the electric motor 41 are exemplary prime motors which rotate a propeller 23. The rotation of the engine 14 is transmitted to the propeller 23 via a propeller shaft 22. Similarly, the rotation of the electric motor 41 is transmitted to the propeller 23 via the propeller shaft 22. Therefore, the propeller shaft 22 is shared by the first and second power trains.

The first power train defines a first transmission path P1 extending from the engine 14 to the propeller shaft 22. The second power train defines a second transmission path P2 extending from the electric motor 41 to the propeller shaft 22. In FIGS. 1 to 3, the first transmission path P1 and the second transmission path P2 are indicated by bold one-dot-and-dash lines. The first transmission path P1 and the second transmission path P2 respectively extending from the engine 14 and the electric motor 41 to the propeller shaft 22 are separated from each other. The first transmission path P1 and the second transmission path P2 are parallel paths independent of each other.

The outboard motor 8 includes a casing 9 in which the first and second power trains are accommodated. The casing 9 includes an engine cover 10 in which the engine 14 is accommodated, an exhaust guide 11 disposed below the engine 14, an upper case 12 disposed below the exhaust guide 11, and a lower case 13 disposed below the upper case 12. The engine cover 10 surrounds the entire periphery of the engine 14. The engine 14 is disposed above the exhaust guide 11. The electric motor 41 is disposed at a lower position than the exhaust guide 11. The electric motor 41 is disposed within the lower case 13. The electric motor 41 may be disposed within the upper case 12 (see FIG. 4).

The engine 14 includes a crank shaft 15 which is rotated about a vertically extending rotation axis. The first power train includes a drive shaft 16 extending downward from the engine 14, and forward-reverse switching gears 17 which transmit the rotation of the drive shaft 16 to the propeller shaft 22. The drive shaft 16 is disposed in the upper case 12 and the lower case 13. The forward-reverse switching gears 17 and the propeller shaft 22 are disposed in the lower case 13. The propeller shaft 22 extends anteroposteriorly in the lower case 13. The propeller 23 is disposed behind the lower case 13. The propeller 23 is attached to a rear end portion of the propeller shaft 22.

The engine 14 rotates the drive shaft 16 in a predetermined rotation direction. The propeller 23 is rotated together with the propeller shaft 22 in a forward direction or a reverse direction. The forward-reverse switching gears 17 are switched to one of a plurality of states including a forward drive state, a neutral state, and a reverse drive state. The forward drive state is such that the rotation in the forward direction is transmitted from the forward-reverse switching gears 17 to the propeller shaft 22. The neutral state is such that the rotation is not transmitted from the forward-reverse switching gears 17 to the propeller shaft 22. The reverse drive state is such that the rotation in the reverse direction is transmitted from the forward-reverse switching gears 17 to the propeller shaft 22.

As shown in FIGS. 2 and 3, the forward-reverse switching gears 17 include a pinion 18 which is rotated together with the drive shaft 16, a front gear 19 which is rotated by the pinion 18, and a rear gear 20 which is rotated in a direction opposite from that of the front gear 19 by the pinion 18. The forward-reverse switching gears 17 further include the first dog clutch 21, which is movable between a connection position at which the first dog clutch 21 is meshed with either one of the front gear 19 and the rear gear 20 and a disconnection position at which the first dog clutch 21 is spaced apart from both of the front gear 19 and the rear gear 20. The pinion 18 functions as a first driving gear which is rotated by the engine 14. The front gear 19 and the rear gear 20 cooperatively function as a first driven gear which is meshed with the first driving gear.

The pinion 18, the front gear 19, and the rear gear 20 are each a bevel gear. The pinion 18 is coaxial with the drive shaft 16, and the front gear 19 and the rear gear 20 are coaxial with the propeller shaft 22. The front gear 19 and the rear gear 20 surround the propeller shaft 22, and are supported by the lower case 13 in a rotatable manner. The front gear 19 and the rear gear 20 are anteroposteriorly opposed to and spaced apart from each other.

The first dog clutch 21 is disposed between the front gear 19 and the rear gear 20. The first dog clutch 21 is located below the pinion 18. The first dog clutch 21 is tubular, and surrounds the propeller shaft 22. The first dog clutch 21 is connected to the propeller shaft 22 by an anteroposteriorly extending spline. The first dog clutch 21 is anteroposteriorly movable with respect to the propeller shaft 22, and is rotatable together with the propeller shaft 22.

The first dog clutch 21 includes a plurality of front projections 21f to be meshed with a plurality of front recesses 19f of the front gear 19, and a plurality of rear projections 21r to be meshed with a plurality of rear recesses 20r of the rear gear 20. The front projections 21f are aligned circumferentially of the first dog clutch 21, and each extend anteroposteriorly along axes of the propeller shaft 22 and the first dog clutch 21. Similarly, the rear projections 21r are aligned circumferentially of the first dog clutch 21, and each extend anteroposteriorly along the axes of the propeller shaft 22 and the first dog clutch 21. The first dog clutch 21, the front recesses 19f, and the rear recesses 20r cooperatively function as a first clutch that connects and disconnects the first transmission path P1.

The first dog clutch 21 is located at one of the forward drive position (shown in FIG. 3), the neutral position (shown in FIG. 2), and a reverse drive position. The forward drive position is such that the first dog clutch 21 is meshed with the front gear 19 to be rotated together with the front gear 19. The reverse drive position is such that the first dog clutch 21 is meshed with the rear gear 20 to be rotated together with the rear gear 20. The neutral position is such that the rotation is not transmitted from the forward-reverse switching gears 17 to the propeller shaft 22. The neutral position is a disconnection position such that the first transmission path P1 is disconnected. The forward drive position and the reverse drive position are connection positions such that the first transmission path P1 is not disconnected.

The outboard motor 8 includes a shift device 31 which shifts the state of the forward-reverse switching gears 17. The shift device 31 includes a shift slider 35 which is anteroposteriorly moved together with the first dog clutch 21, and a connection pin 36 which connects the first dog clutch 21 to the shift slider 35. The shift device 31 further includes a pusher 34 which anteroposteriorly pushes the shift slider 35 to anteroposteriorly move the first dog clutch 21, a shift actuator 32 (see FIG. 1) which generates power to anteroposteriorly move the pusher 34, and a shift rod 33 which transmits the power of the shift actuator 32 to the pusher 34.

As shown in FIG. 1, the shift actuator 32 is disposed in the casing 9. The shift actuator 32 is located at a lower position than the exhaust guide 11. The shift actuator 32 moves up and down the shift rod 33 (see FIGS. 2 and 3) extending upward from the pusher 34, such that the pusher 34 is pivoted about a laterally extending rotation axis. The shift actuator 32 may be an electric motor or an air cylinder, or any other device. Where the shift actuator 32 is the electric motor, the rotation of the shift actuator 32 may be converted into the vertical reciprocal movement of the shift rod 33 by a ball screw and a ball nut, for example.

As shown in FIGS. 2 and 3, the shift slider 35 anteroposteriorly extends in the lower case 13. The shift slider 35 is coaxial with the propeller shaft 22. The shift slider 35 is inserted in a center hole 22h of the propeller shaft 22 extending rearward from a front end surface of the propeller shaft 22. The shift slider 35 is spline coupled to the propeller shaft 22. The shift slider 35 is anteroposteriorly movable with respect to the propeller shaft 22, and is rotatable together with the propeller shaft 22. The shift slider 35 projects forward from the front end surface of the propeller shaft 22.

The shift slider 35 may be a single unitary member, or may include a plurality of members connected to each other. In FIGS. 2 and 3, the shift slider 35 is illustrated as including a front shaft 35s and a rear tube 35t by way of example. The front shaft 35s and the rear tube 35t are inserted in the center hole 22h of the propeller shaft 22. The front shaft 35s is inserted in the rear tube 35t. The front shaft 35s projects forward from the front end surface of the propeller shaft 22. The front shaft 35s is spline coupled to the propeller shaft 22.

The pusher 34 is inserted in an annular groove 35g provided circumferentially of the shift slider 35 about a center axis of the shift slider 35. The shift slider 35 includes an annular front opposed portion 35f and an annular rear opposed portion 35r respectively defining side surfaces of the annular groove 35g. The front opposed portion 35f is located forward of the pusher 34, and the rear opposed portion 35r is located rearward of the pusher 34. The front opposed portion 35f and the rear opposed portion 35r are opposed to the pusher 34 irrespective of the rotation angle of the shift slider 35.

When the shift actuator 32 moves a lower end portion of the pusher 34 forward, the front opposed portion 35f of the shift slider 35 is pushed forward to move the shift slider 35 forward. When the shift actuator 32 moves the lower end portion of the pusher 34 rearward, the rear opposed portion 35r of the shift slider 35 is pushed rearward to move the shift slider 35 rearward. Thus, the first dog clutch 21 is located at one of the forward drive position, the neutral position, and the reverse drive position according to the movement amount of the shift slider 35.

The second power train includes an intermediate shaft 42 which is rotated by the electric motor 41, and a second driving gear 43 which is rotated together with the intermediate shaft 42. The second power train further includes a second driven gear 44 which is rotated by the second driving gear 43, an intermediate ring 45 to be rotated together with the second driven gear 44, and the shift slider 35 surrounded by the second driven gear 44 and the intermediate ring 45. The shift slider 35 is shared by the second power train and the shift device 31.

The intermediate shaft 42 is disposed at a lower position than the electric motor 41. The intermediate shaft 42 extends vertically. The intermediate shaft 42 is parallel or substantially parallel to the drive shaft 16. The intermediate shaft 42 is disposed forward of the drive shaft 16. The intermediate shaft 42 is connected to the second driving gear 43. The intermediate shaft 42 and the second driving gear 43 are rotatable with respect to a tubular shaft housing 47 fixed to the lower case 13. The intermediate shaft 42 is disposed in the shaft housing 47.

The second driving gear 43 and the second driven gear 44 are each a bevel gear. The second driving gear 43 is located above the shift slider 35. The second driven gear 44 is coaxial with the shift slider 35, and surrounds the shift slider 35 in a radially spaced relation. The second driven gear 44 is meshed with the second driving gear 43. The second driven gear 44 is located forward of the front gear 19.

The intermediate ring 45 is coaxial with the shift slider 35, and surrounds the shift slider 35. In FIGS. 2 and 3, the intermediate ring 45 and the second driven gear 44 are illustrated as a single unitary member by way of example. The intermediate ring 45 may be separate from the second driven gear 44 and fixed to the second driven gear 44. The intermediate ring 45 is disposed forward of the front gear 19. The intermediate ring 45 is spaced forwardly from the propeller shaft 22. The intermediate ring 45 is supported rotatably by the lower case 13 via a bearing.

The second power train includes a second clutch that is switched between a connection state in which the intermediate ring 45 is rotated together with the shift slider 35 and a disconnection state in which the intermediate ring 45 and the shift slider 35 are disconnected from each other. The second clutch includes the second dog clutch 46, which is anteroposteriorly movable between a connection position at which the second dog clutch 46 is meshed with the intermediate ring 45 and a disconnection position at which the second dog clutch 46 is spaced apart from the intermediate ring 45. In FIGS. 2 and 3, the second dog clutch 46 and the shift slider 35 are illustrated as a single unitary member. The second dog clutch 46 may be separate from the shift slider 35 and fixed to the shift slider 35.

As shown in FIGS. 2 and 3, the second dog clutch 46 includes a plurality of projections 46c to be meshed with a plurality of recesses 45c of the intermediate ring 45. The projections 46c are aligned circumferentially of the second dog clutch 46. The projections 46c project from the shift slider 35 radially outward of the second dog clutch 46. The recesses 45c are recessed from an inner peripheral surface of the intermediate ring 45 radially outward of the second dog clutch 46. The recesses 45c are aligned circumferentially of the second dog clutch 46. The projections 46c and the recesses 45c are located between the annular groove 35g and the front gear 19 as seen in an anteroposterior direction.

The second dog clutch 46 is located at one of a plurality of positions including a front connection position (shown in FIG. 3), an intermediate connection position (shown in FIG. 2), and a rear disconnection position. When the second dog clutch 46 is located at the front connection position or at the intermediate connection position, the projections 46c are engaged with the recesses 45c. Thus, the second clutch is switched from the disconnection state to the connection state. In the connection state, the rotation is transmitted between the intermediate ring 45 and the shift slider 35 without slippage. In the disconnection state, the rotation is not transmitted between the intermediate ring 45 and the shift slider 35.

The shift device 31 locates the shift slider 35 at one of a plurality of positions including a front position (shown in FIG. 3), an intermediate position (shown in FIG. 2), and a rear position. With the shift slider 35 located at the front position, the first dog clutch 21 is located at the forward drive position and the second dog clutch 46 is located at the front connection position. With the shift slider 35 located at the intermediate position, the first dog clutch 21 is located at the neutral position and the second dog clutch 46 is located at the intermediate connection position. With the shift slider 35 located at the rear position, the first dog clutch 21 is located at the reverse drive position and the second dog clutch 46 is located at the rear disconnection position.

Next, a marine vessel power supply system 50 provided in the marine vessel 1 will be described.

Figure 4:
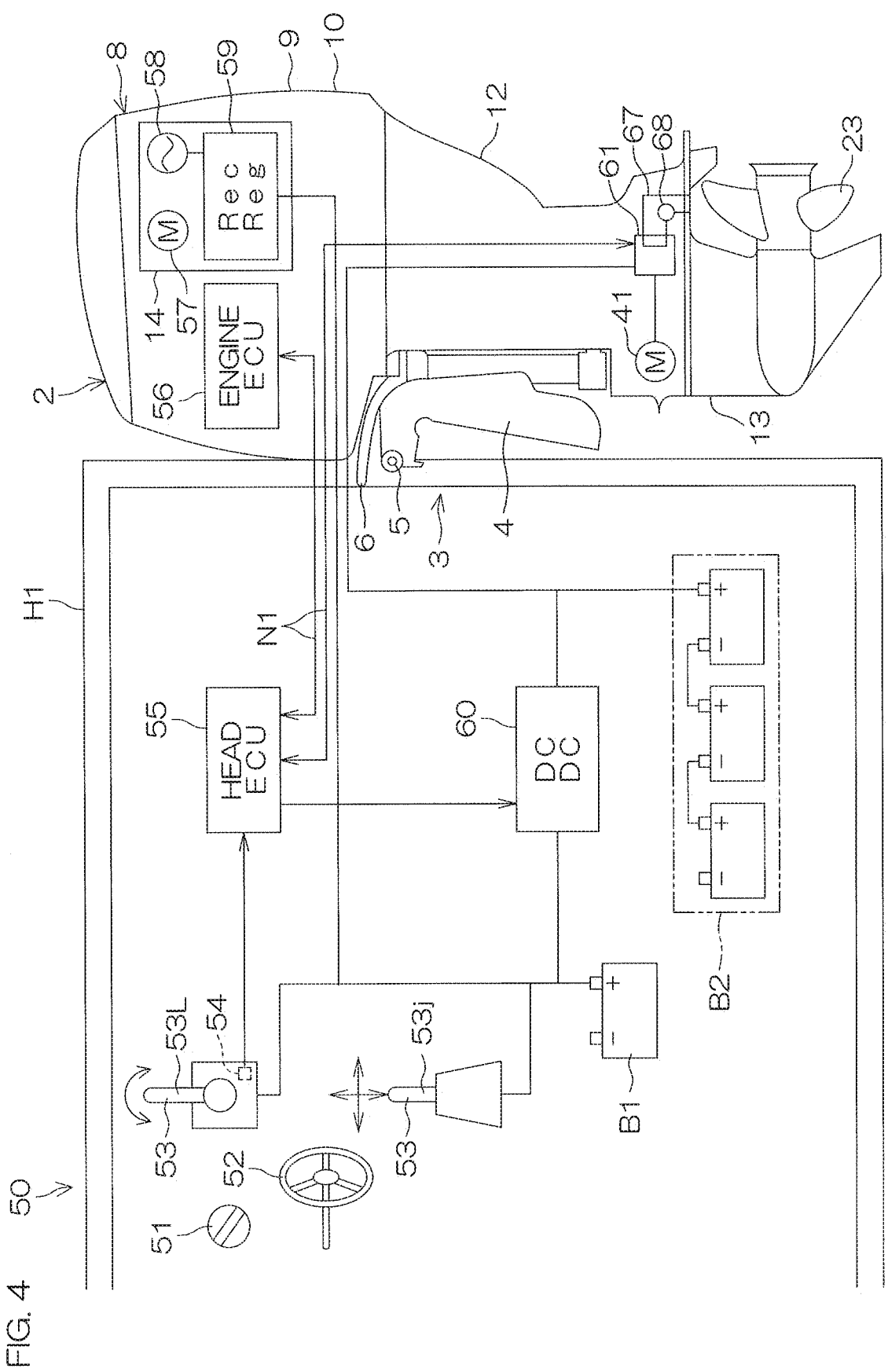
FIG. 4 is a schematic diagram of a marine vessel power supply system.

FIG. 4 is a schematic diagram of the marine vessel power supply system 50. The marine vessel power supply system 50 includes an output adjustment handle 53 which is operated to change the speed of the marine vessel 1 and to switch between the forward drive and the reverse drive of the marine vessel 1, and a steering wheel 52 which is operated to steer the marine vessel 1. The output adjustment handle 53 and the steering wheel 52 are disposed in the hull H1. In FIG. 4, an output adjustment lever 53L which is tilted anteroposteriorly is illustrated as the output adjustment handle 53 by way of example. The output adjustment handle 53 may be a joystick 53j which functions as the output adjustment handle 53 and the steering wheel 52, or may be a device other than the output adjustment lever 53L and the joystick 53j.

The marine vessel power supply system 50 includes an engine ECU 56 (Engine Electronic Control Unit) to control a plurality of electric devices such as the engine 14 provided in the outboard motor 8, and a head ECU 55 (Head Electronic Control Unit) to control a plurality of electric devices such as the engine ECU 56 and the electric motor 41 provided in the marine vessel 1. The engine ECU 56 is disposed in the engine cover 10. The head ECU 55 is disposed in the hull H1. The head ECU 55 is an example of the electronic control unit. The engine ECU 56 and the head ECU 55 are connected to each other via a communication network N1 configured in conformity with communication standards such as CAN (Controller Area Network). The engine ECU 56 and the head ECU 55 send and receive information necessary for the control of the outboard motor 8 and commands via the communication network N1.

The marine vessel power supply system 50 includes a position sensor 54 to detect the position of the output adjustment handle 53. The position sensor 54 is connected to the head ECU 55. When the head ECU 55 acquires handle position information indicative of the position of the output adjustment handle 53 from the position sensor 54, the head ECU 55 controls the shift actuator 32 (see FIG. 1) to position the first dog clutch 21 and the second dog clutch 46 (see FIGS. 2 and 3) at positions according to the handle position information, and controls the engine 14 and the electric motor 41 according to the handle position information.

When the propeller 23 is to be rotated by the engine 14, the head ECU 55 sends a shift control command to the engine ECU 56 in order to position the first dog clutch 21 at the forward drive position or the reverse drive position. The head ECU 55 further sends an engine control command to the engine ECU 56 in order to operate the engine 14 at a rotation speed in a rotation direction according to the position of the output adjustment handle 53. Thus, the rotation of the engine 14 is transmitted to the propeller 23.

When the propeller 23 is to be rotated by the electric motor 41, the head ECU 55 sends a shift control command to the engine ECU 56 in order to position the first dog clutch 21 at the neutral position and to position the second dog clutch 46 at the intermediate connection position. Thereafter, the head ECU 55 rotates the electric motor 41 at a rotation speed in a rotation direction according to the position of the output adjustment handle 53. Thus, the rotation of the electric motor 41 is transmitted to the propeller 23.

The marine vessel power supply system 50 includes a starter motor 57 which starts up the engine 14. The marine vessel power supply system 50 further includes an actuation switch 51 which is operated when the electric devices such as the starter motor 57 provided in the marine vessel 1 are to be actuated, and a main battery B1 to supply electric power to the electric devices provided in the marine vessel 1. The starter motor 57 is disposed in the engine cover 10. The main battery B1 is disposed in the hull H1. When the actuation switch 51 is turned on, the electric power of the main battery B1 is supplied to the starter motor 57 to rotate the starter motor 57. Thus, the engine 14 is started up.

The marine vessel power supply system 50 includes a flywheel magnet 58 which generates AC electric power according to the rotation of the engine 14, and a rectifier/regulator 59 to convert the AC electric power generated by the flywheel magnet 58 to DC electric power. The flywheel magnet 58 and the rectifier/regulator 59 are disposed in the engine cover 10. The flywheel magnet 58 is coaxial with the crank shaft 15 (see FIG. 1). The flywheel magnet 58 is a flywheel which doubles as the electric power generator. The electric power generated by the flywheel magnet 58 is supplied to the electric devices provided in the marine vessel 1 and to one or more batteries such as the main battery B1 provided in the marine vessel 1.

The marine vessel power supply system 50 further includes a motor driving battery B2 which accumulates electric power to be supplied to the electric motor 41, and an inverter 61 to supply the electric power of the motor driving battery B2 to the electric motor 41. The electric motor 41 is driven by AC electric power supplied from the inverter 61. The electric motor 41 may be a three-phase AC motor, a brushless DC motor or other motor, as long as it is rotated by the AC electric power. The motor driving battery B2 is disposed in the hull H1.

The main battery B1 and the motor driving battery B2 are each a storage battery. The main battery B1 and the motor driving battery B2 may be a lead storage battery or other storage battery. The main battery B1 and the motor driving battery B2 each include a plurality of cells connected to each other in series and are repeatedly chargeable and dischargeable, and a battery box in which the plurality of cells are accommodated. In FIG. 4, the main battery B1 is illustrated as including a single battery, and the motor driving battery B2 is illustrated as including three batteries connected in series by way of example. Alternatively, the motor driving battery B2 may include a single battery.

The main battery B1 has a lower rated voltage than the motor driving battery B2. Alternatively, the rated voltage of the main battery B1 may be equal to the rated voltage of the motor driving battery B2, or may be higher than the rated voltage of the motor driving battery B2. Where the rated voltage of the main battery B1 is lower than the rated voltage of the motor driving battery B2, the marine vessel power supply system 50 includes a DC/DC converter 60 which increases the voltage of the DC electric power. The DC/DC converter 60 is disposed in the hull H1.

The main battery B1 and the motor driving battery B2 are connected to the DC/DC converter 60. The flywheel magnet 58 is connected to the DC/DC converter 60 via the rectifier/regulator 59. The DC/DC converter 60 increases the voltage of the DC electric power supplied from at least one of the main battery B1 and the rectifier/regulator 59 to the rated voltage of the motor driving battery B2, and supplies the DC electric power having the increased voltage to the motor driving battery B2. Thus, the motor driving battery B2 is charged.

Figure 5:
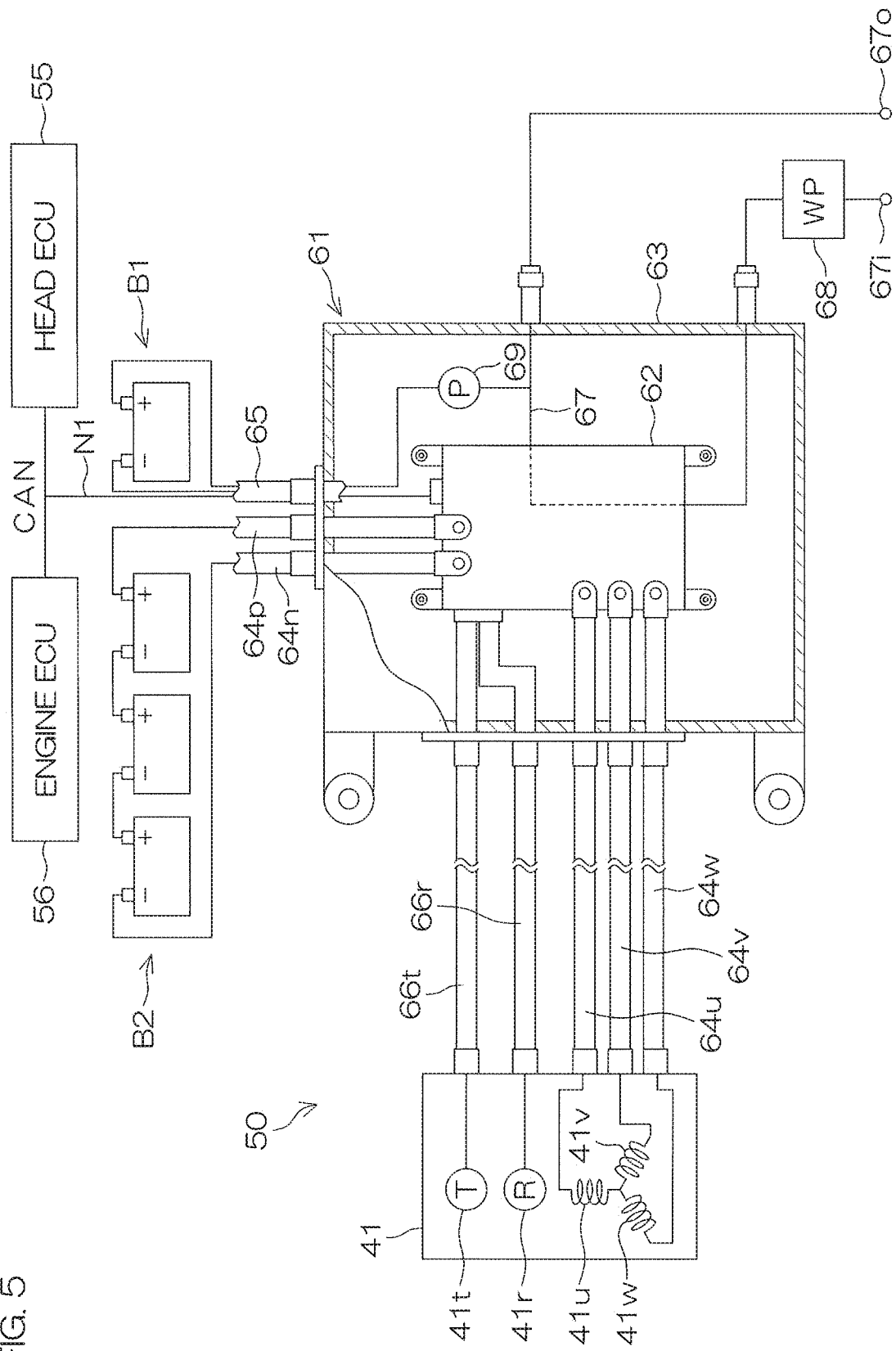
FIG. 5 is a schematic diagram that shows an electric motor, an inverter, and a water pump.

FIG. 5 is a schematic diagram that illustrates the electric motor 41, the inverter 61, and a water pump 68.

The electric motor 41 includes a stator to which the electric power is supplied, and a rotor which is rotated due to the supply of the electric power to the stator. The stator includes a U-phase coil 41*u*, a V-phase coil 41*v*, and a W-phase coil 41*w*. The electric motor 41 further includes a rotation angle sensor 41*r* to detect the rotation angle of the electric motor 41, and a temperature sensor 41*t* to detect the temperature of the electric motor 41. The U-phase coil 41*u*, the V-phase coil 41*v*, and the W-phase coil 41*w* are connected to the inverter 61. Similarly, the rotation angle sensor 41*r* and the temperature sensor 41*t* are connected to the inverter 61.

The inverter 61 includes a main body 62 electrically connected to a load device such as the electric motor 41, and a case 63 defining a sealed space in which the main body 62 is accommodated. The case 63 is disposed in the casing 9 (see FIG. 1) of the outboard motor 8. The case 63 is located at a lower position than the exhaust guide 11 (see FIG. 1). The main body 62 is disposed in the case 63. The main body 62 is connected to a plurality of cables extending through the case 63. The cables each include a covered wire including a conductor through which an electric current flows, and a tubular insulator covering the conductor.

The cables include a U-phase cable 64*u* connecting the U-phase coil 41*u* to the inverter 61, a V-phase cable 64*v* connecting the V-phase coil 41*v* to the inverter 61, and a W-phase cable 64*w* connecting the W-phase coil 41*w* to the inverter 61. The U-phase cable 64*u*, the V-phase cable 64*v*, and the W-phase cable 64*w* define the wirings 77*u*, 77*v*, and 77W (see FIGS. 6 and 7), i.e., three-phase wirings, that connect the inverter 61 and the electric motor 41. The cables further include a positive electrode cable 64*p* which connects the positive electrode of the motor driving battery B2 to the inverter 61, and a negative electrode cable 64*n* which connects the negative electrode of the motor driving battery B2 to the inverter 61.

The cables further include a control cable 65 which connects the communication network N1 to the inverter 61, and connects the main battery B1 to the inverter 61. The inverter 61 is connected to the head ECU 55 and the engine ECU 56 via the control cable 65. The cables further include a control cable 66*r* which connects the rotation angle sensor 41*r* to the inverter 61, and a control cable 66*t* which connects the temperature sensor 41*t* to the inverter 61. The rotation angle sensor 41*r* and the temperature sensor 41*t* are each connected to the head ECU 55 and the engine ECU 56 via the inverter 61.

The outboard motor 8 includes a cooling water channel 67 which guides water taken in from outside the marine vessel 1 to the inverter 61, and a water pump 68 which sucks the water from outside the marine vessel 1 into the cooling water channel 67. The cooling water channel 67 and the water pump 68 are disposed in the casing 9 (see FIG. 1) of the outboard motor 8. The cooling water channel 67 extends through the inverter 61. The main body 62 defines a portion of the cooling water channel 67. The cooling water channel 67 includes a water inlet port 67*i* through which the water is sucked in from outside the marine vessel 1, and a water outlet port 67*o* through which the water taken in through the water inlet port 67*i* is discharged to the outside of the outboard motor 8. The water inlet port 67*i* and the water outlet port 67*o* each open to the outer surface of the outboard motor 8.

The water pump 68 is an electric pump which is operated due to the supply of the electric power. The water pump 68 may be a mechanical pump to be driven by the engine 14 (see FIG. 1). The water pump 68, when being driven, generates a suction force to suck in the water from outside the marine vessel 1 through the water inlet port 67*i* of the cooling water channel 67. Thus, the water flows into the cooling water channel 67 from outside the marine vessel 1 through the water inlet port 67*i* of the cooling water channel 67 to pass through the inverter 61. The water passing through the inverter 61 is drained to the outside of the outboard motor 8 through the water outlet port 67*o* of the cooling water channel 67. In this manner, the inverter 61 is cooled with the water taken in from outside the marine vessel 1.

The outboard motor 8 includes, in addition to the cooling water channel 67 and the water pump 68, a water pressure sensor 69 to detect the internal water pressure of the cooling water channel 67. The water pressure sensor 69 is disposed outside the main body 62 in the sealed space of the case 63. The water pressure sensor 69 may be disposed outside the inverter 61. The water pressure sensor 69 is connected to the head ECU 55 and the engine ECU 56 via the control cable 65. The internal water pressure of the cooling water channel 67 detected by the water pressure sensor 69 is sent to at least one of the head ECU 55 and the engine ECU 56.

Figure 6:
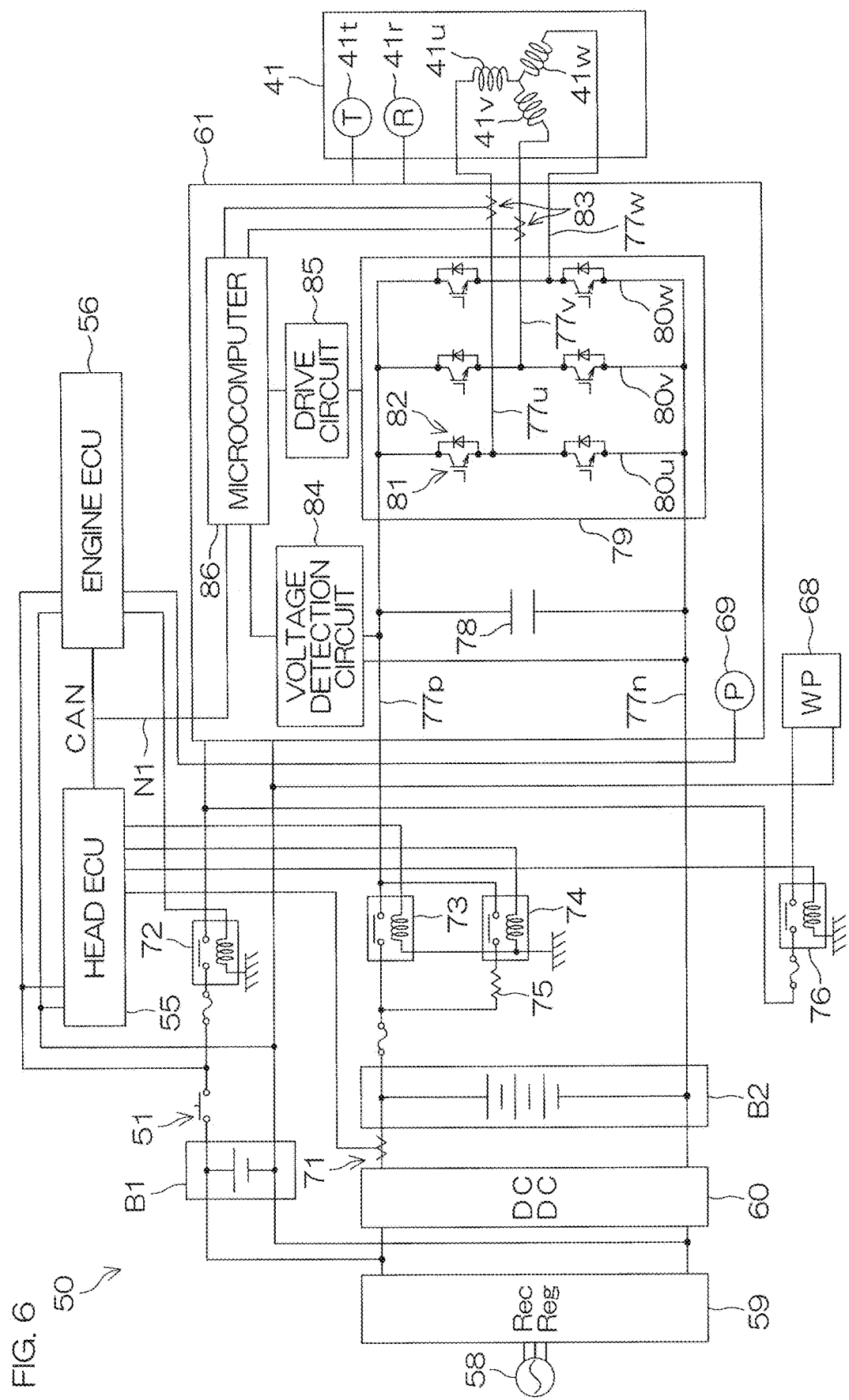
FIG. 6 is a block diagram of the marine vessel power supply system.
Figure 7:
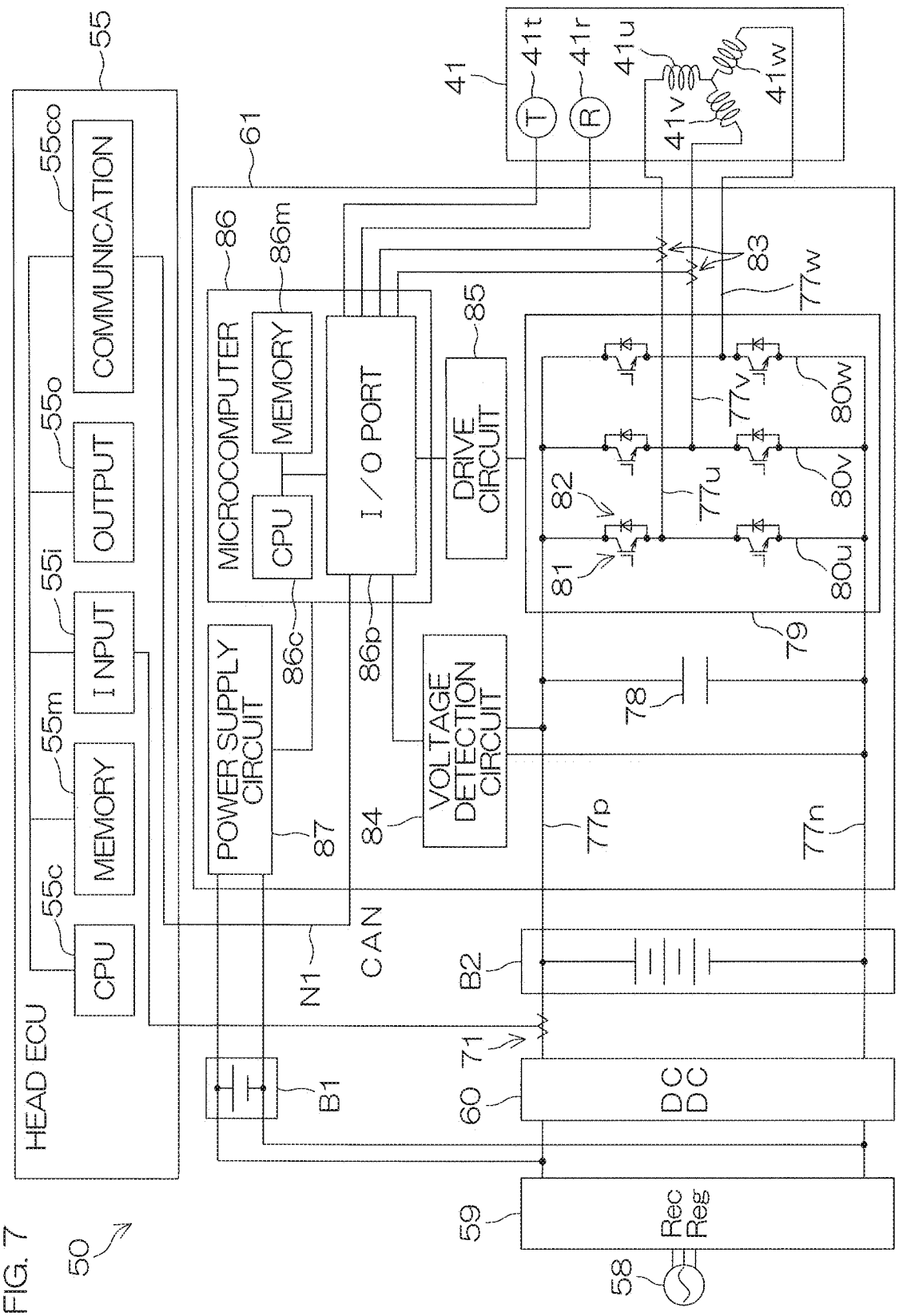
FIG. 7 is another block diagram of the marine vessel power supply system.

FIGS. 6 and 7 are block diagrams of the marine vessel power supply system 50.

As shown in FIG. 6, the flywheel magnet 58, which is an example of the electric power generator, is connected to the rectifier/regulator 59. The DC/DC converter 60 and the main battery B1 are connected to the rectifier/regulator 59. The DC/DC converter 60 and the main battery B1 are connected in parallel. The motor driving battery B2 is connected to the DC/DC converter 60.

The electric power generated by the flywheel magnet 58 is supplied to at least one of the DC/DC converter 60 and the main battery B1 via the rectifier/regulator 59. The DC/DC converter 60 increases the voltage of the DC electric power supplied from the rectifier/regulator 59 or the main battery B1, and supplies the DC electric power having the increased voltage to the motor driving battery B2.

The marine vessel power supply system 50 includes a current sensor 71 to detect an electric current between the motor driving battery B2 and the DC/DC converter 60. The marine vessel power supply system 50 may include, instead of the current sensor 71, a current detection circuit to detect the electric current between the motor driving battery B2 and the DC/DC converter 60. The current sensor 71 is capable of detecting an electric current flowing through a wiring connecting the motor driving battery B2 and the DC/DC converter 60. The current sensor 71 detects the electric current flowing through the wiring between the positive electrode of the motor driving battery B2 and the DC/DC converter 60. The value of the electric current detected by the current sensor 71 is sent to the head ECU 55.

The positive electrode of the motor driving battery B2 is connected to the inverter 61 via a main relay 73. Further, the positive electrode of the motor driving battery B2 is connected to the inverter 61 via a precharge relay 74 and an electric resistance 75. The precharge relay 74 and the electric resistance 75 are connected in parallel to the main relay 73. The negative electrode of the motor driving battery B2 is connected to the negative electrode of the inverter 61. The main relay 73 and the precharge relay 74 are normally open. The main relay 73 and the precharge relay 74 are opened and closed by the head ECU 55.

The positive electrode of the main battery B1 is connected to the inverter 61 via the actuation switch 51 and a relay 72. The positive electrode of the main battery B1 is further connected to the water pump 68 via the actuation switch 51, the relay 72, and a relay 76. The inverter 61 and the water pump 68 are connected in parallel. The negative electrode of the main battery B1 is connected to the inverter 61 and the water pump 68. The relay 72 and the relay 76 are normally open. The relay 72 and the relay 76 are opened and closed by the engine ECU 56.

As shown in FIG. 7, the inverter 61 includes an inverter circuit 79 to convert the electric power between the DC electric power and the AC electric power, a smoothing capacitor 78 to reduce or prevent fluctuation of the DC voltage applied by the inverter circuit 79, and a drive circuit 85 which drives the inverter circuit 79. The inverter 61 further includes a microcomputer 86 to control the drive circuit 85, and a power supply circuit 87 to supply electric power supplied from a power source such as the main battery B1 to the microcomputer 86.

The inverter circuit 79 includes a U-phase circuit 80u including a U-phase upper atm and a U-phase lower atm directly connected to each other, a V-phase circuit 80v including a V-phase upper atm and a V-phase lower atm directly connected to each other, and a W-phase circuit 80w including a W-phase upper atm and a W-phase lower atm directly connected to each other. The alms each include a switching element 81 such as IGBT (Insulated Gate Bipolar Transistor), and a freewheeling diode 82 connected in parallel to the switching element 81. The drive circuit 85 switches the respective switching elements 81 according to a command supplied from the microcomputer 86.

The inverter 61 includes a positive electrode wiring 77p connected to the positive electrode of the motor driving battery B2, and a negative electrode wiring 77n connected to the negative electrode of the motor driving battery B2. The U-phase circuit 80u, the V-phase circuit 80v, and the W-phase circuit 80w are each connected to the positive electrode and the negative electrode of the motor driving battery B2 via the positive electrode wiring 77p and the negative electrode wiring 77n. The smoothing capacitor 78 is also connected to the positive electrode and the negative electrode of the motor driving battery B2 via the positive electrode wiring 77p and the negative electrode wiring 77n.

The smoothing capacitor 78 is disposed between the inverter circuit 79 and the motor driving battery B2. The U-phase circuit 80u, the V-phase circuit 80v, the W-phase circuit 80w, and the smoothing capacitor 78 are connected in parallel.

The inverter 61 further includes a U-phase wiring 77u connected to the U-phase coil 41u, a V-phase wiring 77v connected to the V-phase coil 41v, and a W-phase wiring 77w connected to the W-phase coil 41w. The U-phase wiring 77u is connected to the U-phase circuit 80u between the U-phase upper arm and the U-phase lower arm. The V-phase wiring 77v is connected to the V-phase circuit 80v between the V-phase upper arm and the V-phase lower arm. The W-phase wiring 77w is connected to the W-phase circuit 80w between the W-phase upper arm and the W-phase lower arm. The U-phase circuit 80u is connected to the U-phase coil 41u via the U-phase wiring 77u. The V-phase circuit 80v is connected to the V-phase coil 41v via the V-phase wiring 77v. The W-phase circuit 80w is connected to the W-phase coil 41w via the W-phase wiring 77w.

The inverter 61 includes a voltage detection circuit 84 to detect a voltage between the motor driving battery B2 and the inverter circuit 79. More specifically, the voltage detection circuit 84 detects the voltage in the wirings 77p and 77n which connect the motor driving battery B2 to the inverter circuit 79 (more precisely, a voltage between the wirings 77p and 77n). The inverter 61 may include, instead of the voltage detection circuit 84, a voltage sensor to detect the voltage between the motor driving battery B2 and the inverter circuit 79. The voltage detection circuit 84 is connected between the positive electrode and the negative electrode of the motor driving battery B2 via the positive electrode wiring 77p and the negative electrode wiring 77n. Therefore, the voltage detection circuit 84 detects a voltage between the opposite electrodes of the motor driving battery B2. The voltage detection circuit 84 is connected to the inverter circuit 79 in parallel. The value of the voltage detected by the voltage detection circuit 84 is sent to the microcomputer 86.

The inverter 61 includes a plurality of current sensors 83 which each detect an electric current between the electric motor 41 and the inverter circuit 79. The inverter 61 may include, instead of the plurality of current sensors 83, a plurality of current detection circuits which each detect the electric current between the electric motor 41 and the inverter circuit 79. The current sensors 83 are provided in at least two of the U-phase wiring 77u, the V-phase wiring 77v, and the W-phase wiring 77w. In FIG. 7, two current sensors 83 are respectively provided in the U-phase wiring 77u and the V-phase wiring 77v by way of example. The current sensors 83 are able to detect electric currents flowing through the wirings which connect the inverter circuit 79 to the electric motor 41. The values of the electric currents detected by the current sensors 83 are sent to the microcomputer 86.

The microcomputer 86 includes a memory 86m which stores information such as a program, a CPU 86c (central processing unit) which performs computations and issues commands according to the program stored in the memory 86m, and an I/O port 86p (input/output port 86p) which acquires and outputs information and commands. The I/O port 86p is connected to the communication network N1. The microcomputer 86 communicates with the head ECU 55 and other electric devices via the I/O port 86p.

The head ECU 55 includes a memory 55m which stores information such as a program, and a CPU 55c which performs computations and issues commands according to the program stored in the memory 55m. The head ECU 55 further includes an input interface 55*i* which acquires detection values of the sensors provided in the marine vessel 1, an output interface 55*o* which drives the electric devices provided in the marine vessel 1, and a communication interface 55*co* which communicates with the other devices via the communication network N1. The I/O port 86*p* of the inverter 61 is connected to the communication interface 55*co* via the communication network N1.

The microcomputer 86 of the inverter 61 acquires the value of the voltage detected by the voltage detection circuit 84 of the inverter 61 through the I/O port 86*p* of the inverter 61, and transmits the acquired detected voltage value to the head ECU 55 through the I/O port 86*p* of the inverter 61. Similarly, the microcomputer 86 of the inverter 61 acquires the values of the electric currents detected by the current sensors 83 of the inverter 61 through the I/O port 86*p* of the inverter 61, and transmits the acquired detected current values to the head ECU 55 through the I/O port 86*p* of the inverter 61.

Figure 8:
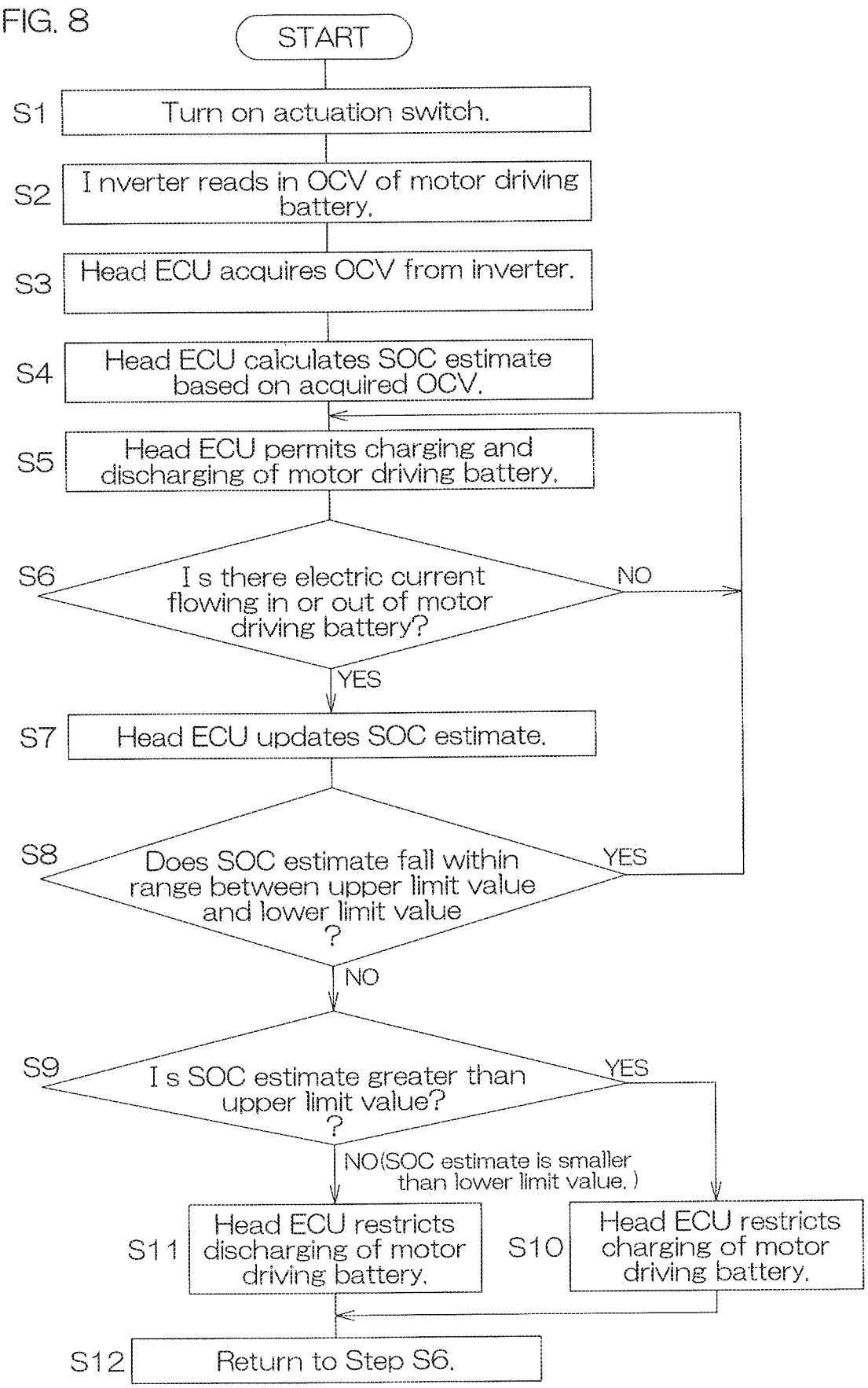
FIG. 8 is a flow chart that shows a process flow for monitoring the state of charge of a battery for driving the motor.

FIG. 8 is a flowchart that shows a process flow to monitor the state of charge of the motor driving battery B2. In the following description, reference will be made to FIGS. 6 to 8.

When the actuation switch 51 is turned on (Step S1 in FIG. 8), the electric power of the main battery B1 is supplied to the head ECU 55 and the engine ECU 56 to actuate the head ECU 55 and the engine ECU 56. Thereafter, the engine ECU 56 closes the relay 72 (see FIG. 6) to supply the electric power of the main battery B1 to the inverter 61. Thus, the inverter 61 is actuated. The head ECU 55 closes the precharge relay 74 (see FIG. 6) to supply the electric power of the motor driving battery B2 to the smoothing capacitor 78 of the inverter 61. Thus, electric charge is accumulated in the smoothing capacitor 78.

After the electric charge is accumulated in the smoothing capacitor 78, the head ECU 55 opens the precharge relay 74, and closes the main relay 73 (see FIG. 6). With the main relay 73 closed, the smoothing capacitor 78 is charged until the voltage of the smoothing capacitor 78 is equal or substantially equal to the voltage of the motor driving battery B2. Thus, preparation to supply the electric power of the motor driving battery B2 to the electric motor 41 via the inverter 61 is completed.

The voltage of the motor driving battery B2 (the voltage between the electrodes of the motor driving battery B2) observed when the electric current does not flow between the electric motor 41 and the inverter 61 corresponds to the OCV of the motor driving battery B2. The OCV of the motor driving battery B2 correlates with the SOC which indicates the remaining electric power amount of the motor driving battery B2. The SOC is expressed, for example, as a percentage from 0% to 100%. An SOC of 0% means that the remaining electric power amount is zero, and an SOC of 100% means that the remaining electric power amount is maximum.

The voltage detection circuit 84 of the inverter 61 starts detecting the voltage after the actuation of the inverter 61. The microcomputer 86 of the inverter 61 continuously transmits the detected voltage value acquired from the voltage detection circuit 84 to the head ECU 55. When the voltage of the smoothing capacitor 78 is equal or substantially equal to the voltage of the motor driving battery B2, the voltage detected by the voltage detection circuit 84 corresponds to the OCV of the motor driving battery B2. After the main relay 73 is closed, therefore, the inverter 61 (microcomputer 86) reads in the OCV of the motor driving battery B2 from the voltage detection circuit 84 (Step S2 in FIG. 8). The inverter 61 sends the OCV to the head ECU 55.

When the head ECU 55 acquires the OCV of the motor driving battery B2 from the inverter 61 (Step S3 in FIG. 8), the head ECU 55 calculates an SOC estimate (an estimated SOC value) of the motor driving battery B2 based on the acquired OCV (Step S4 in FIG. 8). Further, the head ECU 55 permits the charging and the discharging of the motor driving battery B2 (Step S5 in FIG. 8).

When the output adjustment handle 53 (see FIG. 4) is operated after the charging and the discharging of the motor driving battery B2 is permitted, as required, the head ECU 55 transmits to the inverter 61 a motor driving command to operate the electric motor 41 at a rotation speed in a rotation direction according to the position of the output adjustment handle 53. The inverter 61 supplies the electric power of the motor driving battery B2 to the electric motor 41 to rotate the electric motor 41 according to the motor driving command. Thus, the electric current flows between the electric motor 41 and the motor driving battery B2. When the electric power generated by the electric motor 41 which doubles as the electric power generator is supplied to the motor driving battery B2 via the inverter 61, the electric current flows between the electric motor 41 and the motor driving battery B2.

The head ECU 55 starts monitoring the electric current flowing in and out of the motor driving battery B2 after permitting the charging and the discharging of the motor driving battery B2. Specifically, the head ECU 55 monitors, based on the detected electric current values acquired from the current sensors 83 and the current sensor 71, whether or not the electric current flowing in or out of the motor driving battery B2 is present (Step S6 in FIG. 8).

If the electric current is not present (NO in Step S6 in FIG. 8), the head ECU 55 continues to monitor the electric current (Step S6 in FIG. 8) while permitting the charging and the discharging of the motor driving battery B2 (Step S5 in FIG. 8). If the electric current is present (YES in Step S6 in FIG. 8), the head ECU 55 updates the SOC estimate based on the detected electric current values acquired from the current sensors 83 and the current sensor 71 (Step S7 in FIG. 8). Thereafter, the head ECU 55 judges whether or not the SOC estimate falls within a range between an upper limit value and a lower limit value (Step S8 in FIG. 8).

If the updated SOC estimate falls within the range between the upper limit value and the lower limit value (YES in Step S8 in FIG. 8), the head ECU 55 continues to monitor the electric current (Step S6 in FIG. 8) while permitting the charging and the discharging of the motor driving battery B2 (Step S5 in FIG. 8). If the updated SOC estimate is greater than the upper limit value (YES in Step S9 in FIG. 8), the head ECU 55 restricts the charging of the motor driving battery B2 (Step S10 in FIG. 8), and then continues to monitor the electric current (Step S12 in FIG. 8). If the updated SOC estimate is smaller than the lower limit value (NO in Step S9 in FIG. 8), the head ECU 55 restricts the discharging of the motor driving battery B2 (Step S10 in FIG. 8), and then continues to monitor the electric current (Step S12 in FIG. 8).

If the SOC estimate falls back within the range between the upper limit value and the lower limit value (YES in Step S8 in FIG. 8) after the charging or the discharging of the motor driving battery B2 is restricted (Step S11 or Step S12 in FIG. 8), the head ECU 55 permits the charging and the discharging of the motor driving battery B2 (Step S5 in FIG. 8). Thus, the motor driving battery B2 is charged and discharged without any restriction.

In a preferred embodiment of the present invention, as described above, when the head ECU 55 sends the command to the microcomputer 86 of the inverter 61, the DC electric power of the motor driving battery B2 is converted to the AC electric power by the inverter circuit 79 of the inverter 61, and the AC electric power is supplied to the electric motor 41. Thus, the electric motor 41 is driven to rotate the propeller 23. The voltage detection circuit 84 of the inverter 61, which is an example of the voltage detector, detects the voltage in the wiring which connects the motor driving battery B2 to the inverter circuit 79. The OCV of the motor driving battery B2, which is detected by the voltage detection circuit 84 of the inverter 61, is sent to the head ECU 55 from the microcomputer 86 of the inverter 61. The head ECU 55 estimates the state of charge of the motor driving battery B2 based on the OCV of the motor driving battery B2 acquired from the inverter 61. Since the OCV of the motor driving battery B2 is thus determined by using the voltage detection circuit 84 and the microcomputer 86 of the inverter 61, there is no need to additionally provide the voltage sensor or the voltage detection circuit to detect the OCV of the motor driving battery B2. Further, there is no need to additionally provide the communication module for communications with the head ECU 55. Thus, the remaining electric power amount of the motor driving battery B2 is more accurately determined without the addition of the sensor and the like.

In a preferred embodiment of the present invention, when the actuation switch 51 is turned on to actuate the inverter 61 and the head ECU 55, the OCV of the motor driving battery B2 is detected by the voltage detection circuit 84 of the inverter 61, and is sent to the head ECU 55 from the microcomputer 86 of the inverter 61. Thereafter, the electric power of the motor driving battery B2 is supplied to the electric motor 41 via the inverter 61. After the electric power of the motor driving battery B2 is supplied to the electric motor 41 via the inverter 61, it is impossible to accurately measure the OCV of the motor driving battery B2 until the voltage of the motor driving battery B2 is stabilized. Therefore, the value of the voltage detected by the voltage detection circuit 84 is acquired before the electric power of the motor driving battery B2 is supplied to the electric motor 41, such that the OCV is accurately and speedily acquired. This obviates the need for waiting for the stabilization of the voltage of the motor driving battery B2.

In a preferred embodiment of the present invention, the current sensors 83, which are examples of the current detector, are provided in addition to the voltage detection circuit 84 in the inverter 61. When the inverter 61 and the head ECU 55 are actuated by the operation of the actuation switch 51, the OCV of the motor driving battery B2 is detected by the voltage detection circuit 84 of the inverter 61, and is sent to the head ECU 55 from the microcomputer 86 of the inverter 61. Thus, the SOC estimate of the motor driving battery B2 is determined. When the electric power of the motor driving battery B2 is thereafter supplied to the electric motor 41 via the inverter 61, the electric current flowing between the motor driving battery B2 and the electric motor 41 is detected by the current sensors 83 of the inverter 61, and is sent to the head ECU 55 from the microcomputer 86 of the inverter 61. The head ECU 55 updates the SOC estimate based on the detected electric current values acquired from the microcomputer 86 of the inverter 61. When the motor driving battery B2 is charged or discharged after the update of the SOC estimate, the head ECU 55 updates the SOC estimate again based on the detected electric current values acquired from the microcomputer 86 of the inverter 61. Thus, the latest SOC estimate is determined in real time. Further, the SOC estimate is updated by using the current sensors 83 and the microcomputer 86 of the inverter 61, obviating the need for additionally providing the current sensor or the current detection circuit and the need for additionally providing the communication module for communications with the head ECU 55.

In a preferred embodiment of the present invention, the OCV of the motor driving battery B2 is sent to the head ECU 55 from the microcomputer 86 of the inverter 61, and the head ECU 55 determines the SOC estimate of the motor driving battery B2. The head ECU 55 continuously updates the SOC estimate based on the electric current values detected by the current sensors 83 of the inverter 61 until the actuation switch 51 is thereafter turned off to stop the inverter 61 and the head ECU 55. At this time, the voltage value detected by the voltage detection circuit 84 of the inverter 61 is not taken into consideration.

After the electric power of the motor driving battery B2 is supplied to the electric motor 41 via the inverter 61, as described above, it is impossible to accurately measure the OCV of the motor driving battery B2 until the voltage of the motor driving battery B2 is stabilized. Therefore, the SOC estimate is updated based on the integrated value of the electric current flowing in and out of the motor driving battery B2. Thus, the state of charge of the motor driving battery B2 is more accurately determined as compared with a case in which the SOC estimate is updated based on the voltage of the motor driving battery B2.

In a preferred embodiment of the present invention, the rectifier/regulator 59 converts the AC electric power generated by the flywheel magnet 58 (an example of the electric power generator) to the DC electric power. The DC/DC converter 60 increases the voltage of the DC electric power supplied from the rectifier/regulator 59, and supplies the DC electric power having the increased voltage to the motor driving battery B2. Therefore, even if the voltage of the DC electric power supplied from the rectifier/regulator 59 is lower than the rated voltage of the motor driving battery B2, the electric power generated by the flywheel magnet 58 is supplied to the motor driving battery B2 to charge the motor driving battery B2.

In a preferred embodiment of the present invention, the electric motor 41 and the inverter 61 are disposed outside the hull H1. Therefore, the electric motor 41 and the inverter 61 are disposed near the water surface around the marine vessel 1. The temperature is lower near the water surface than at a position spaced apart from the water surface. Therefore, the electric motor 41 and the inverter 61 are cooled with lower temperature air.

In a preferred embodiment of the present invention, the inverter 61 is disposed in the casing 9, and the inverter circuit 79, the voltage detection circuit 84, and the microcomputer 86 of the inverter 61 are disposed in the case 63 of the inverter 61. Thus, the inverter circuit 79 and the like are protected from solid matter such as dust and liquid such as water. Particularly, seawater or freshwater is present around the marine vessel 1 and, therefore, water splash and water droplets are liable to intrude into the marine vessel 1. Thus, the inverter circuit 79 and the like are protected from the water.

In a preferred embodiment of the present invention, the water pump 68 sucks in water from outside the marine vessel 1, and supplies the water to the cooling water channel 67. The water flowing in the cooling water channel 67 passes through the case 63 of the inverter 61 to cool the inverter 61.

If the cooling liquid is circulated in the marine vessel 1 to cool the inverter 61, the temperature of the cooling liquid is liable to be gradually increased. In contrast, the temperature of the water outside the marine vessel 1 is generally constant irrespective of the period of use of the marine vessel 1. Therefore, the inverter 61 is cooled with the water having a stable temperature.

In a preferred embodiment of the present invention, the internal water pressure of the cooling water channel 67 is detected by the water pressure sensor 69 making it possible to detect whether or not the water is supplied into the cooling water channel 67. Further, the water pressure sensor 69 is disposed in the case 63 of the inverter 61, and the inverter 61 is disposed in the casing 9, so that the water pressure sensor 69 is protected from solid matter such as dust and liquid such as water.

In a preferred embodiment of the present invention, both the electric motor 41 and the inverter 61 are mounted on the casing 9 of the outboard motor 8. It is, therefore, possible to complete the wiring between the electric motor 41 and the inverter 61, i.e., the three-phase wirings, at the casing 9. The three-phase wirings 77u, 77v, and 77W are substantially free from being affected by the steering of the outboard motor 8, thus contributing to a stable control of the electric motor 41. It is unnecessary to perform the wiring between the electric motor 41 and the inverter 61 when attaching the outboard motor 8 to the hull H1 because it is performed when assembling the outboard motor 8 in a factory. This makes it possible to attain a precise wiring length between the electric motor 41 and the inverter 61, thus attaining a stable control of the electric motor 41. Further, it is also possible to attain a short wiring length, which reduces noise that arises when the electric motor 41 is energized, thus reducing the effects of the noise on the electronic components of the system as well as the peripheral equipment.

As mentioned above, both the electric motor 41 and the inverter 61 may be mounted on the upper case 12 (see FIG. 4). With this arrangement, it is possible to complete the wiring between the electric motor 41 and the inverter 61, i.e., the three-phase wirings 77u, 77v, and 77w, at the upper case 12 (within the upper case 12 in this preferred embodiment). The wiring length is therefore further shortened and is further precisely defined. Additionally, it becomes easier to apply the same wiring length to different models of the outboard motor 8. This enables to reduce wiring variations between the electric motor 41 and the inverter 61, and the man-hours to adapt the control parameters in the system to the wiring length are also reduced accordingly.

Figure 9:
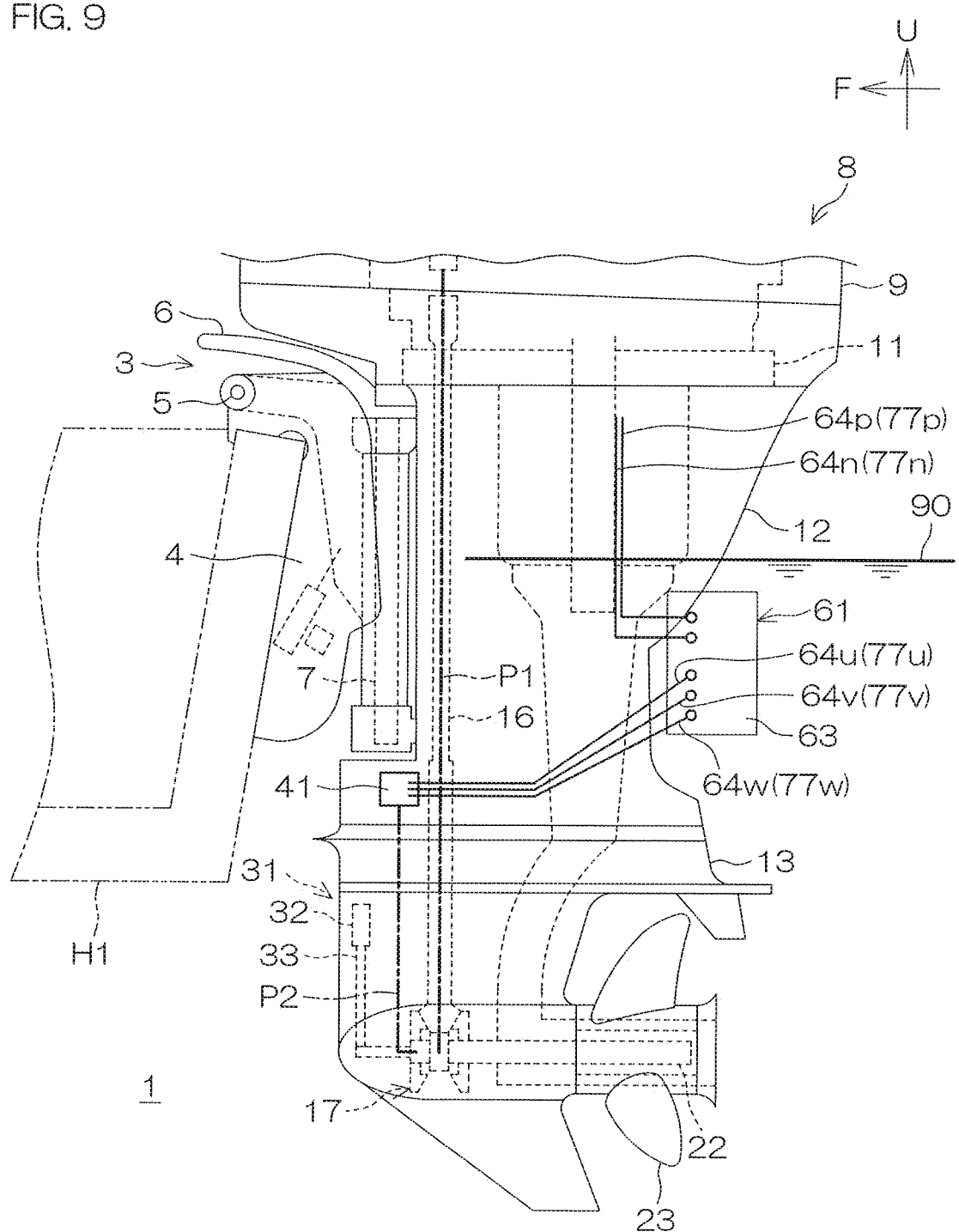
FIG. 9 is a schematic diagram showing an arrangement of another preferred embodiment of the present invention.

FIG. 9 is a schematic diagram showing an arrangement of another preferred embodiment of the present invention. The same reference signs are used in the description of the present preferred embodiment for components corresponding to those in the above-described preferred embodiments.

In the present preferred embodiment, both the electric motor 41 and the inverter 61 are mounted on the casing 9 of the outboard motor 8. Specifically, both the electric motor 41 and the inverter 61 are mounted on the upper case 12. More specifically, the electric motor 41 is housed in the upper case 12. The case 63 of the inverter 61 is, on the other hand, attached to the upper case 12 such that at least a portion of the case 6 is exposed to the outside of the upper case 12. In the present preferred embodiment, not less than about half of the outer surface of the case 63, preferably not less than about 70% of the outer surface of the case 63, is disposed outside the upper case 12. The mounting height of the case 63 is designed such that at least a portion of the case 63, preferably an entire portion of the case 63, is disposed under a water level 90 when the marine vessel 1 is in use. In other words, the case 63 is disposed at a height that is determined such that at least a portion, preferably an entire portion, of the case 63 is under water around the outboard motor 8.

Similarly to the above-described preferred embodiments, in the present preferred embodiment, both the electric motor 41 and the inverter 61 are mounted on the casing 9 of the outboard motor 8. It is therefore possible to complete the wiring between the electric motor 41 and the inverter 61, i.e., the three-phase wirings 77u, 77v, and 77w at the casing 9 so as to attain a stable control of the electric motor 41. Moreover, a precise wiring length between the electric motor 41 and the inverter 61 is attained, which also contributes to a stable control of the electric motor 41. Further, it is possible to reduce the wiring length, which reduces noise that arises when the electric motor 41 is energized, thus reducing the effects of such noise on the electronic components of the system as well as peripheral equipment.

In the present preferred embodiment, both the electric motor 41 and the inverter 61 are mounted on the upper case 12, which makes it possible to complete the wiring between the electric motor 41 and the inverter 61, i.e., three-phase wirings 77u, 77v, and 77w, in the upper case 12. It is, therefore, possible to further shorten the wiring and to more precisely define the wiring length. Moreover, it becomes easier to apply the same wiring length to different models of the outboard motor 8, thus reducing variations of the wirings between the electric motor 41 and the inverter 61, and man-hours to adapt the control parameters in the system to the wiring length are accordingly reduced. Although portions of the three-phase wirings 77u, 77v, and 77w (more specifically, portions of the three-phase cables 64u, 64v, and 64w) are disposed outside the upper case 12 and outside the case 63 in the arrangement shown in FIG. 9, this does not substantially affect the above-described technical advantages. It is possible to use a design in which entire portions of the three-phase cables 64u, 64v, and 64w are disposed within the upper case 12 and the case 63.

Transom lengths may be different among different models of the outboard motor 8. It is still preferable to use designs to maintain the relative positions of the electric motor 41 and the inverter 61 at the upper case 12 while attachments are introduced to cope with the different transom lengths. This makes it possible to reduce the variations of the wiring lengths, and, accordingly, to reduce man-hours to adapt the control parameters in the system to the wiring length.

In the present preferred embodiment, the case 63 of the inverter 61 is located at a height such that the case 63 is under water outside the upper case 12. This makes it possible to cool the inverter 61 with water around the outboard motor 8. It is, therefore, possible to omit a pump to send cooling water to cool the inverter 61, and to omit a cooling water channel from a pump to the inverter 61.

The present invention is not limited to the preferred embodiments described above, but various modifications may be made.

For example, the outboard motor 8 may be an outboard motor 8 of an electric type to rotate the propeller 23 by the electric motor 41 alone rather than the outboard motor 8 which is of a hybrid type to rotate the propeller 23 by at least one of the engine 14 and the electric motor 41.

The propeller 23 may be attached to a portion of the propulsion system 2 other than the outboard motor 8. For example, the propeller 23 may be attached to a side thruster (e.g., a bow thruster) which generates a propulsive force laterally of the hull H1.

At least one of the electric motor 41 and the inverter 61 may be disposed outside the casing 9 of the outboard motor 8. At least one of the electric motor 41 and the inverter 61 may be disposed inside the hull H1.

The cooling water channel 67 which guides the water supplied to the inverter 61 does not have to extend through the case 63 of the inverter 61. In this case, a portion of the cooling water channel 67 may be disposed on the outer surface of the case 63. The cooling water channel 67 may be an endless flow channel through which the cooling liquid such as water is circulated in the marine vessel 1.

If the current detection circuit or the current sensor to detect the electric current flowing between the motor driving battery B2 and the electric motor 41 is provided, the inverter 61 does not have to include the current sensors 83 which are examples of the current detector.

If the voltage of the motor driving battery B2 is stabilized in a certain period of time before the actuation switch 51 is turned off after the calculation of the SOC estimate, the head ECU 55 may update the SOC estimate based on the value of the voltage detected by the voltage detection circuit 84 of the inverter 61 and acquired from the microcomputer 86 of the inverter 61.

If the voltage of the DC electric power rectified by the rectifier/regulator 59 equals the rated voltage of the motor driving battery B2, the electric power generated by the flywheel magnet 58 may be supplied to the motor driving battery B2 without increasing the voltage with the DC/DC converter 60. In this case, the DC/DC converter 60 may be eliminated. The motor driving battery B2 does not have to be charged with the electric power generated by the flywheel magnet 58.

Two or more of the arrangements described above may be used in combination.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A marine vessel power supply system for a marine vessel including an electric motor to rotate a propeller, the marine vessel power supply system comprising:
    an inverter to supply electric power to the electric motor;
    a battery to supply electric power to the inverter; and
    an electronic control unit configured or programmed to control the inverter; wherein
    the inverter includes:
        an inverter circuit to convert DC electric power supplied from the battery to AC electric power;
        a voltage detector to detect a voltage in a wiring between the battery and the inverter circuit; and
        a microcomputer configured or programmed to communicate with the electronic control unit and to control the inverter circuit according to a command supplied from the electronic control unit; and
    the electronic control unit is configured or programmed to calculate an SOC estimate indicative of an estimated state-of-charge value of the battery based on a value of the voltage detected by the voltage detector and acquired from the microcomputer.

2. The marine vessel power supply system according to claim 1, further comprising:
    an actuation switch operable by a user when a plurality of electric devices including the inverter and the electronic control unit are to be actuated; wherein
    the electronic control unit is configured or programmed to calculate the SOC estimate based on the detected voltage value acquired from the microcomputer before the electric power is supplied to the electric motor from the inverter after the plurality of electric devices are actuated by the operation of the actuation switch.

3. The marine vessel power supply system according to claim 2, wherein
    the inverter further includes a current detector to detect an electric current flowing between the battery and the electric motor; and
    the electronic control unit is configured or programmed to update the SOC estimate based on a value of the electric current detected by the current detector and acquired from the microcomputer after the SOC estimate is calculated based on the detected voltage value acquired from the microcomputer.

4. The marine vessel power supply system according to claim 3, wherein the electronic control unit is configured or programmed to continuously update the SOC estimate based on the detected electric current value acquired from the microcomputer without consideration of the detected voltage value acquired from the microcomputer until the actuation switch is turned off after the SOC estimate is calculated based on the detected voltage value acquired from the microcomputer.

5. The marine vessel power supply system according to claim 1, further comprising:
    an electric power generator;
    a rectifier/regulator to convert AC electric power generated by the electric power generator to DC electric power; and
    a DC/DC converter to receive the DC electric power from the rectifier/regulator, to increase a voltage of the DC electric power received from the rectifier/regulator, and to supply the DC electric power having the increased voltage to the battery.

6. A marine vessel comprising:
    a marine vessel power supply system;
    a propeller;
    an electric motor to receive electric power supplied thereto from the marine vessel power supply system and to rotate the propeller; and
    a hull to travel on water due to the rotation of the propeller; wherein
    the marine vessel power supply system includes:
        an inverter to supply electric power to the electric motor;
        a battery to supply electric power to the inverter; and
        an electronic control unit configured or programmed to control the inverter;
    the inverter includes:
        an inverter circuit to convert DC electric power supplied from the battery to AC electric power;
        a voltage detector to detect a voltage in a wiring between the battery and the inverter circuit; and
        a microcomputer configured or programmed to communicate with the electronic control unit and to control the inverter circuit according to a command supplied from the electronic control unit; and
    the electronic control unit is configured or programmed to calculate an SOC estimate indicative of an estimated state-of-charge value of the battery based on a value of the voltage detected by the voltage detector and acquired from the microcomputer.

7. The marine vessel according to claim 6, wherein
the marine vessel power supply system further includes an actuation switch that is operated by a user when a plurality of electric devices including the inverter and the electronic control unit are to be actuated; and
the electronic control unit is configured or programmed to calculate the SOC estimate based on the detected voltage value acquired from the microcomputer before the electric power is supplied to the electric motor from the inverter after the plurality of electric devices are actuated by the operation of the actuation switch.

8. The marine vessel according to claim 7, wherein
the inverter further includes a current detector to detect an electric current flowing between the battery and the electric motor; and
the electronic control unit is configured or programmed to update the SOC estimate based on a value of the electric current detected by the current detector and acquired from the microcomputer after the SOC estimate is calculated based on the detected voltage value acquired from the microcomputer.

9. The marine vessel according to claim 8, wherein the electronic control unit is configured or programmed to continuously update the SOC estimate based on the detected electric current value acquired from the microcomputer without consideration of the detected voltage value acquired from the microcomputer until the actuation switch is turned off after the SOC estimate is calculated based on the detected voltage value acquired from the microcomputer.

10. The marine vessel according to claim 6, wherein the marine vessel power supply system further includes:
an electric power generator;
a rectifier/regulator to convert AC electric power generated by the electric power generator to DC electric power; and
a DC/DC converter to receive the DC electric power from the rectifier/regulator, to increase a voltage of the DC electric power received from the rectifier/regulator, and to supply the DC electric power having the increased voltage to the battery.

11. The marine vessel according to claim 6, wherein the electric motor and the inverter are disposed outside the hull.

12. The marine vessel according to claim 6, further comprising:
a casing that accommodates the inverter; wherein
the inverter further includes a case that accommodates the inverter circuit, the voltage detector, and the microcomputer.

13. The marine vessel according to claim 12, further comprising:
a cooling water channel extending through the case of the inverter; and
a water pump to supply water from outside the marine vessel into the cooling water channel.

14. The marine vessel according to claim 13, further comprising a water pressure sensor provided in the case of the inverter to detect an internal water pressure of the cooling water channel.

15. The marine vessel according to claim 6, further comprising:
a cooling water channel to guide water to cool the inverter; and
a water pump to supply the water from outside the marine vessel into the cooling water channel.

16. The marine vessel according to claim 6, wherein the electric motor and the inverter are mounted on a casing of an outboard motor that includes the propeller.

17. The marine vessel according to claim 16, wherein the casing includes a lower case to which the propeller is attached and an upper case coupled to the lower case and arranged above the lower case, and the electric motor and the inverter are mounted on the upper case.

18. The marine vessel according to claim 17, wherein a case of the inverter is located at a height such that at least a portion of the case is under water outside the upper case.

* * * * *